(12) United States Patent
Umezaki

(10) Patent No.: US 9,245,909 B2
(45) Date of Patent: Jan. 26, 2016

(54) SEMICONDUCTOR DEVICE

(71) Applicant: Semiconductor Energy Laboratory Co., Ltd., Atsugi-shi, Kanagawa-ken (JP)

(72) Inventor: Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/521,513

(22) Filed: Oct. 23, 2014

(65) Prior Publication Data

US 2015/0053986 A1 Feb. 26, 2015

Related U.S. Application Data

(63) Continuation of application No. 13/693,208, filed on Dec. 4, 2012, now Pat. No. 8,872,299.

(30) Foreign Application Priority Data

Dec. 5, 2011 (JP) .................................. 2011-265799

(51) Int. Cl.
*H01L 27/12* (2006.01)
*H01L 27/07* (2006.01)
(Continued)

(52) U.S. Cl.
CPC .......... *H01L 27/1255* (2013.01); *G11C 19/184* (2013.01); *G11C 19/28* (2013.01); *H01L 27/0733* (2013.01); *H01L 27/124* (2013.01); *H01L 27/1251* (2013.01); *G09G 3/3266* (2013.01); *G09G 2310/0267* (2013.01); *G09G 2310/0286* (2013.01); *G09G 2320/043* (2013.01)

(58) Field of Classification Search
CPC ............ H01L 27/1251; H01L 27/0733; G11C 19/184; G09G 2310/0267
USPC ....................................... 257/444, 71; 345/81
See application file for complete search history.

(56) References Cited

U.S. PATENT DOCUMENTS 6,975,142 B2 12/2005 Azami et al.
7,038,653 B2 5/2006 Moon
(Continued)

FOREIGN PATENT DOCUMENTS

JP 2002-328643 A 11/2002
JP 2004-103226 A 4/2004

OTHER PUBLICATIONS

Fukumoto.E et al., "High Mobility Oxide Semiconductor TFT for Circuit Integration of AM-OLED", IDW '10 : Proceedings of the 16th International Display Workshops, Dec. 1, 2010, pp. 631-634.

*Primary Examiner* — Caridad Everhart
(74) *Attorney, Agent, or Firm* — Fish & Richardson P.C.

(57) ABSTRACT

A semiconductor device capable of high-speed operation. The semiconductor device includes a first transistor, a second transistor, and a capacitor. One of a source and a drain of the first transistor is supplied with a first signal. One of a source and a drain of the second transistor is supplied with a first potential. A gate of the second transistor is supplied with a second signal. A first electrode of the capacitor is electrically connected to the other of the source and the drain of the first transistor. A second electrode of the capacitor is electrically connected to the other of the source and the drain of the second transistor. In a first period, the first signal is low and the second signal is high. In a second period, the first signal is high and the second signal is either low or high.

19 Claims, 16 Drawing Sheets

(51) Int. Cl.
  *G11C 19/18*   (2006.01)
  *G11C 19/28*   (2006.01)
  *G09G 3/32*    (2006.01)

(56) References Cited

U.S. PATENT DOCUMENTS

| | | | |
|---|---|---|---|
| 7,586,478 B2 | 9/2009 | Azami et al. | |
| 7,674,650 B2 | 3/2010 | Akimoto et al. | |
| 7,732,819 B2 | 6/2010 | Akimoto et al. | |
| 7,903,079 B2 | 3/2011 | Azami et al. | |
| 7,910,490 B2 | 3/2011 | Akimoto et al. | |
| 7,932,521 B2 | 4/2011 | Akimoto et al. | |
| 8,067,775 B2 | 11/2011 | Miyairi et al. | |
| 8,207,756 B2 | 6/2012 | Shionoiri et al. | |
| 2001/0052940 A1 | 12/2001 | Hagihara et al. | |
| 2004/0251846 A1 | 12/2004 | Choi et al. | |
| 2006/0164376 A1 | 7/2006 | Moon | |
| 2008/0308796 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0305461 A1 | 12/2009 | Akimoto et al. | |
| 2010/0110623 A1 | 5/2010 | Koyama et al. | |
| 2010/0133533 A1 | 6/2010 | Umezaki | |
| 2010/0136743 A1 | 6/2010 | Akimoto et al. | |
| 2010/0252826 A1 | 10/2010 | Yamazaki et al. | |
| 2011/0057918 A1 | 3/2011 | Kimura et al. | |
| 2011/0084960 A1 | 4/2011 | Miyake et al. | |
| 2011/0089417 A1 | 4/2011 | Yamazaki et al. | |
| 2011/0089975 A1 | 4/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0140108 A1 | 6/2011 | Kimura et al. | |
| 2011/0148497 A1 | 6/2011 | Ishii | |
| 2011/0149189 A1 | 6/2011 | Azami et al. | |
| 2011/0156024 A1 | 6/2011 | Koyama et al. | |
| 2011/0163311 A1 | 7/2011 | Akimoto et al. | |
| 2011/0176357 A1 | 7/2011 | Koyama et al. | |
| 2011/0193182 A1 | 8/2011 | Takemura | |
| 2011/0193832 A1* | 8/2011 | Hirabayashi | 345/204 |
| 2011/0199365 A1 | 8/2011 | Umezaki et al. | |
| 2011/0215787 A1 | 9/2011 | Shionoiri et al. | |
| 2011/0227066 A1 | 9/2011 | Umezaki | |
| 2011/0278564 A1 | 11/2011 | Yoneda | |
| 2011/0285442 A1 | 11/2011 | Saito | |
| 2012/0051117 A1 | 3/2012 | Yamazaki et al. | |
| 2012/0061668 A1 | 3/2012 | Miyairi et al. | |
| 2012/0063206 A1 | 3/2012 | Furutani et al. | |
| 2012/0099360 A1 | 4/2012 | Takemura | |
| 2012/0140550 A1 | 6/2012 | Endo et al. | |
| 2012/0182788 A1 | 7/2012 | Kurokawa | |

* cited by examiner

FIG. 11A
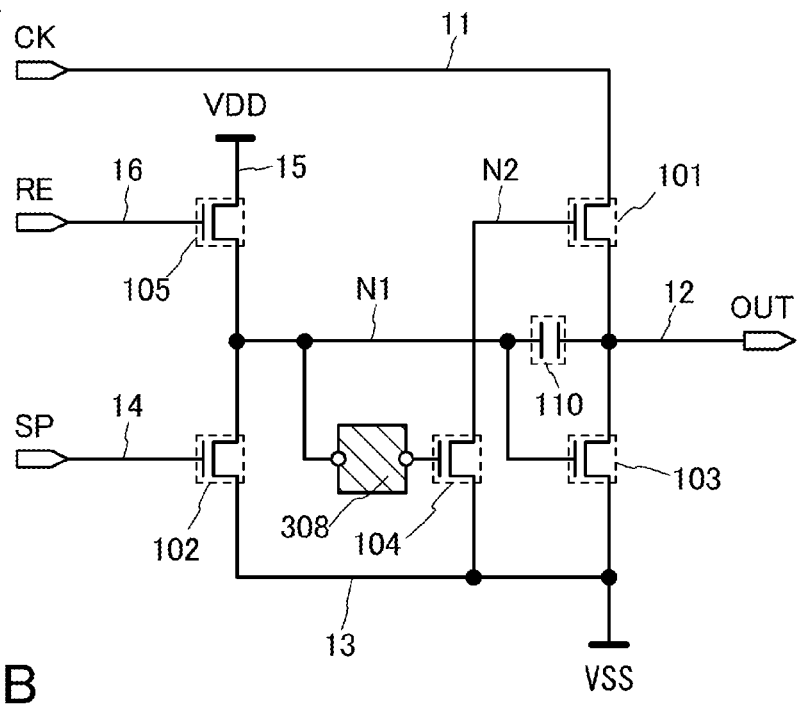
FIG. 11B
FIG. 11C
FIG. 11D
FIG. 11E
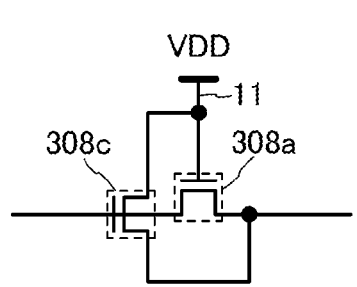
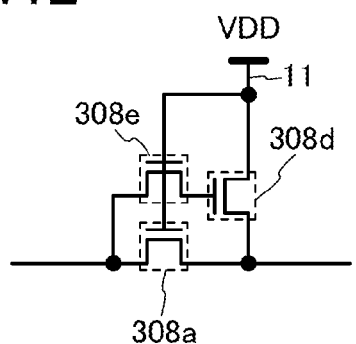

SEMICONDUCTOR DEVICE

CROSS-REFERENCE TO RELATED APPLICATIONS

This application is a continuation of U.S. application Ser. No. 13/693,208, filed Dec. 4, 2012, now allowed, which claims the benefit of a foreign priority application filed in Japan as Serial No. 2011-265799 on Dec. 5, 2011, both of which are incorporated by reference.

BACKGROUND OF THE INVENTION

1. Field of the Invention

One embodiment of the present invention relates to semiconductor devices, display devices, and the like.

2. Description of the Related Art

The increase in size of display devices such as liquid crystal display devices and EL display devices promotes the development of display devices with higher added value. In particular, techniques by which a driver circuit in a display device is composed of only transistors having the same conductivity type have been actively developed (see Patent Document 1).

FIG. 16 illustrates a driver circuit disclosed in Patent Document 1. The driver circuit in Patent Document 1 includes transistors M1 to M7. When a signal GOUT[N−1] goes high, the transistor M3 is turned on. Thus, a voltage VON is supplied to a gate of the transistor M1, so that the gate potential of the transistor M1 starts to rise. Since the gate potential of the transistor M1 rises gradually, a potential difference between a gate and source (hereinafter also referred to as Vgs) of the transistor M3 decreases gradually. Then, Vgs of the transistor M3 becomes the threshold voltage of the transistor M3, and the transistor M3 is turned off.

REFERENCE

Patent Document 1: Japanese Published Patent Application No. 2004-103226

SUMMARY OF THE INVENTION

In the driver circuit in Patent Document 1, Vgs of the transistor M3 decreases gradually as the gate potential of the transistor M1 rises. That is, the drain current of the transistor M3 decreases gradually. As a result, the time after the signal GOUT[N−1] goes high until the transistor M3 is turned off is long. In addition, the gate of the transistor M1 needs to be brought into a floating state by turning off the transistor M3 before a signal CKV goes high. Consequently, it is difficult to increase the driving frequency of the driver circuit in Patent Document 1.

Further, in the driver circuit in Patent Document 1, the ratio of channel width (W) to channel length (L) (hereinafter referred to as W/L) of the transistor M3 needs to be increased in order to raise the gate potential of the transistor M1 rapidly. Thus, the size of the transistor M3 increases, resulting in the increase in layout area.

In the driver circuit in Patent Document 1, the gate of the transistor M1 is required to be floating. However, charge is leaked from the gate of the transistor M1 because of the off-state current of a transistor whose source or drain is connected to the gate of the transistor M1. It is therefore difficult to prolong a period during which the gate of the transistor M1 is floating. That is, it is difficult to lower the driving frequency.

As described above, it is difficult to both increase and lower the driving frequency of the driver circuit in Patent Document 1, so that the range of the driving frequencies at which the driver circuit operates normally is narrow.

In view of the above, an object of one embodiment of the present invention is to provide a driver circuit that can operate even at high driving frequencies. Another object is to provide a driver circuit that can operate even at low driving frequencies. Another object is to provide a driver circuit that can operate at a wide range of driving frequencies. Another object is to decrease W/L of a transistor. Still another object is to provide a circuit having a novel configuration. Note that an object and an effect are inseparable, and it is apparent that an effect described in this specification and the like is accompanied by an object associated with the effect. On the other hand, it is apparent that an object described in this specification and the like is accompanied by an effect associated with the object.

One embodiment of the present invention is a semiconductor device including a first transistor, a second transistor, and a capacitor. One of a source and a drain of the first transistor is supplied with a first signal. One of a source and a drain of the second transistor is supplied with a first potential. A gate of the second transistor is supplied with a second signal. A first electrode of the capacitor is electrically connected to the other of the source and the drain of the first transistor. A second electrode of the capacitor is electrically connected to the other of the source and the drain of the second transistor. In a first period, the first signal is low and the second signal is high. In a second period, the first signal is high and the second signal is either low or high.

Another embodiment of the present invention is a semiconductor device including a first transistor, a second transistor, a third transistor, and a capacitor. One of a source and a drain of the first transistor is supplied with a first signal. One of a source and a drain of the second transistor is supplied with a first potential. A gate of the second transistor is supplied with a second signal. One of a source and a drain of the third transistor is supplied with the first signal. A gate of the third transistor is electrically connected to a gate of the first transistor. A first electrode of the capacitor is electrically connected to the other of the source and the drain of the first transistor. A second electrode of the capacitor is electrically connected to the other of the source and the drain of the second transistor. In a first period, the first signal is low and the second signal is high. In a second period, the first signal is high and the second signal is either low or high.

In any of the above embodiments of the present invention, the semiconductor device may also include a fourth transistor, a fifth transistor, and a sixth transistor. One of a source and a drain of the fourth transistor is supplied with the first potential. The other of the source and the drain of the fourth transistor is electrically connected to the other of the source and the drain of the first transistor. A gate of the fourth transistor is electrically connected to the other of the source and the drain of the second transistor. One of a source and a drain of the fifth transistor is supplied with the first potential. The other of the source and the drain of the fifth transistor is electrically connected to the gate of the first transistor. A gate of the fifth transistor is electrically connected to the other of the source and the drain of the second transistor. One of a source and a drain of the sixth transistor is supplied with a second potential. The other of the source and the drain of the sixth transistor is electrically connected to the other of the source and the drain of the second transistor. A gate of the sixth transistor is supplied with a third signal.

In any of the above embodiments of the present invention, W/L of the first transistor may be higher than that of the second transistor.

Embodiments of the present invention can provide a driver circuit that can operate even at high driving frequencies, provide a driver circuit that can operate even at low driving frequencies, provide a driver circuit that can operate at a wide range of driving frequencies, and decrease W/L of a transistor.

BRIEF DESCRIPTION OF THE DRAWINGS

In the accompanying drawings:

FIGS. 11A to 11E are diagrams for explaining a sequential circuit according to one embodiment of the present invention;

DETAILED DESCRIPTION OF THE INVENTION

Figure 1A:
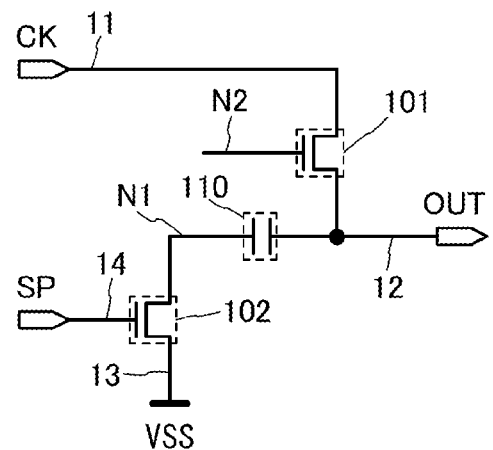
FIGS. 1A and 1B are diagrams for explaining a basic circuit according to one embodiment of the present invention.
Figure 1B:
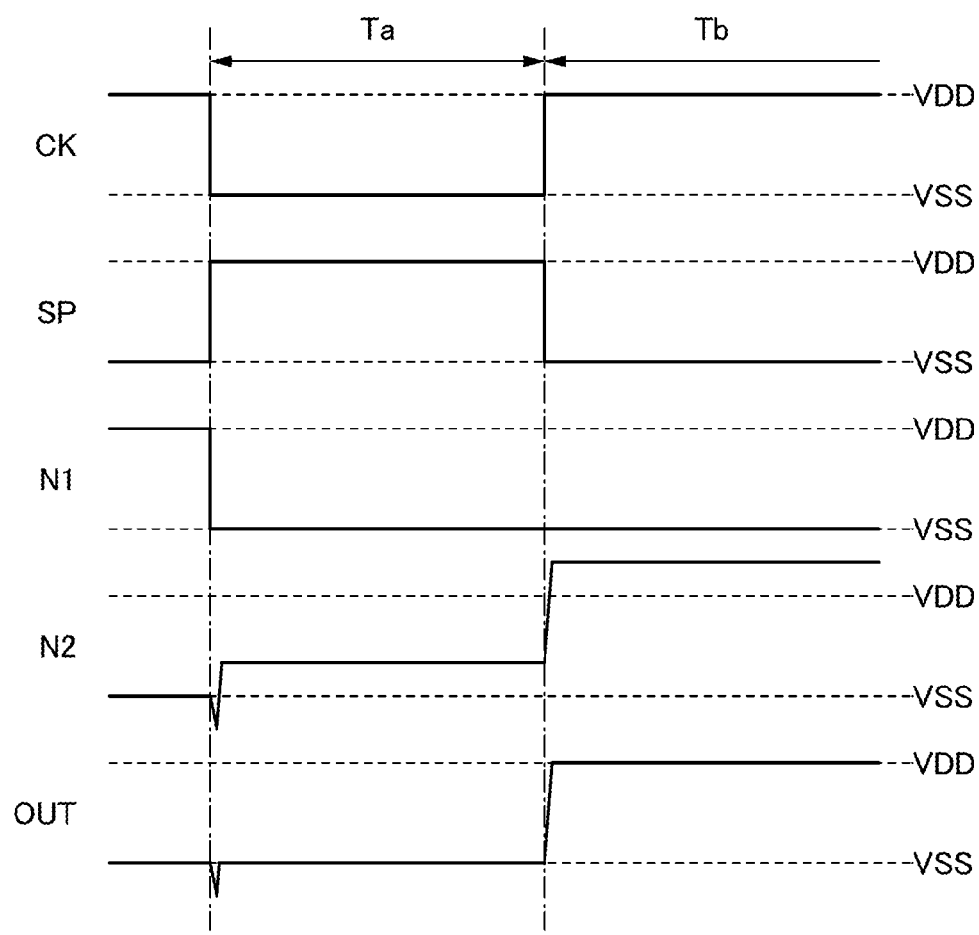
Figure 2A:
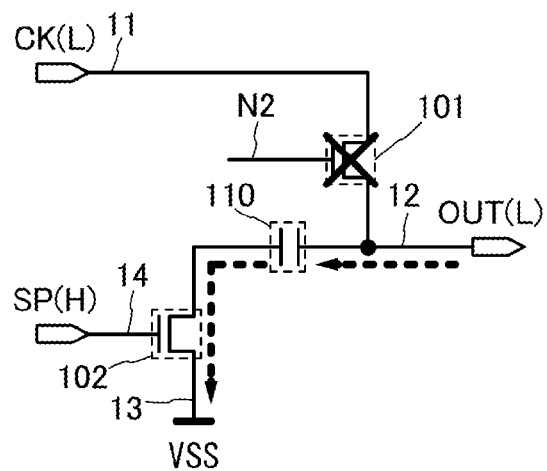
FIGS. 2A to 2C are diagrams for explaining a basic circuit according to one embodiment of the present invention.
Figure 2B:
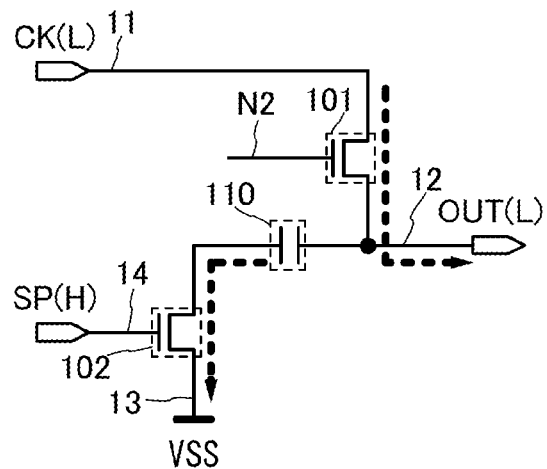
Figure 2C:
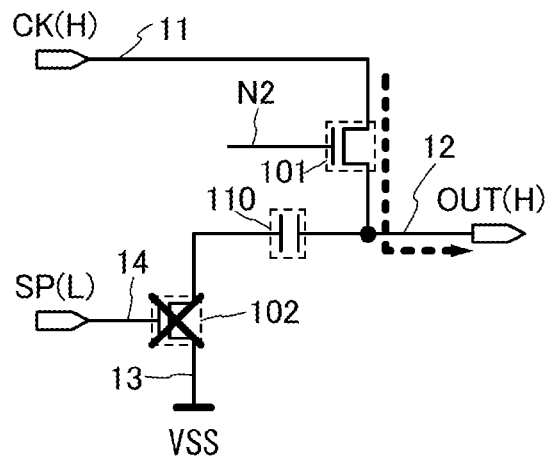

Examples of embodiments of the present invention will be described below with reference to the accompanying drawings. Note that it will be readily appreciated by those skilled in the art that details of the embodiments can be modified without departing from the spirit and scope of the present invention. The present invention is therefore not limited to the following description of the embodiments.

Note that the present invention includes, in its category, any semiconductor device including transistors, for example, integrated circuits, RF tags, and display devices. The integrated circuit includes, in its category, large scale integrated circuits (LSIs) including a microprocessor, an image processing circuit, a digital signal processor (DSP), a microcontroller, and the like and programmable logic devices (PLDs) such as a field programmable gate array (FPGA) and a complex PLD (CPLD). The display device includes, in its category, a liquid crystal display device, a light-emitting device in which a light-emitting element typified by an organic light-emitting element (OLED) is provided in each pixel, electronic paper, a digital micromirror device (DMD), a plasma display panel (PDP), a field emission display (FED), and the like.

In this specification, the display device includes, in its category, a panel in which a display element such as a liquid crystal element or a light-emitting element is provided in each pixel, and a module in which an IC or the like including a controller is mounted on the panel.

Note that in this specification, the term "connection" means electrical connection and corresponds to a state in which current, voltage, or a potential can be supplied or transmitted. Therefore, a state of being "connected" means not only a state of direct connection but also a state of indirect connection through an element such as a wiring, a resistor, a diode, or a transistor, in which current, voltage, or a potential can be supplied or transmitted. In addition, even when independent components are connected to each other in a circuit diagram, there is actually a case where one conductive film has functions of a plurality of components, such as the case where part of a wiring functions as an electrode. The term "connection" in this specification also means such a case where one conductive film has functions of a plurality of components.

Note that a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, for convenience, connection relation of the transistor is sometimes described assuming that the source and the drain are fixed; actually, the names of the source and the drain interchange with each other depending on the relation of the potentials.

(Embodiment 1)

In this embodiment, a basic circuit, a sequential circuit including the basic circuit, and a shift register circuit including the sequential circuit which are embodiments of the present invention will be described.

First, the configuration of a basic circuit in this embodiment will be described with reference to FIG. 1A.

The basic circuit in FIG. 1A includes a transistor 101, a transistor 102, and a capacitor 110.

A first terminal of the transistor 101 is connected to a wiring 11. A second terminal of the transistor 101 is connected to a wiring 12.

A first terminal of the transistor 102 is connected to a wiring 13. A gate of the transistor 102 is connected to a wiring 14.

A first electrode (also referred to as one electrode) of the capacitor 110 is connected to the wiring 12. A second electrode (also referred to as the other electrode) of the capacitor 110 is connected to a second terminal of the transistor 102.

Note that the second terminal of the transistor 102 or the second electrode of the capacitor 110 is indicated by a node N1. A gate of the transistor 101 is indicated by a node N2.

Note that the transistor 101 and the transistor 102 preferably have the same conductivity type. In this embodiment, the case where these transistors are n-channel transistors will be described.

Note that in this specification and the like, the term "connection" means electrical connection and corresponds to a state in which current, voltage, a potential, a signal, charge, or the like can be supplied or transmitted. The state of being "connected" therefore means not only a state of direct connection but also a state of indirect connection through an element such as a wiring, a conductive film, a resistor, a diode, a transistor, or a switching element, for example.

A first terminal of a transistor is also referred to as one of a source and a drain of the transistor or a first electrode of the transistor. A second terminal of the transistor is also referred to as the other of the source and the drain of the transistor or a second electrode of the transistor.

The wiring 11 (also referred to as signal line) is supplied with a signal CK and has a function of transmitting or supplying the signal CK. The signal CK is a signal having high and low levels. The signal CK corresponds to one of a plurality of clock signals input to a shift register circuit.

The wiring 12 (also referred to as signal line) outputs a signal OUT and has a function of transmitting or supplying the signal OUT. The signal OUT is a signal having high and low levels. Moreover, the signal OUT is an output signal of the basic circuit illustrated in FIG. 1A. The signal OUT corresponds to one of a plurality of output signals output from a shift register circuit or an output signal of a sequential circuit.

The wiring 13 (also referred to as power supply line) is supplied with a potential VSS (also referred to as first potential) and has a function of transmitting or supplying the potential VSS. The potential VSS is a constant potential.

The wiring 14 (also referred to as signal line) is supplied with a signal SP and has a function of transmitting or supplying the signal SP. The signal SP is a signal having high and low levels. Further, the signal SP is a signal for controlling the on/off state of the transistor 102. The signal SP corresponds to, for example, a start pulse input to a shift register circuit or an output signal of the preceding sequential circuit or any sequential circuit before the preceding sequential circuit.

The transistor 101 has a function of controlling electrical continuity between the wiring 11 and the wiring 12, a function of supplying the signal CK of the wiring 11 to the wiring 12, and a function of maintaining a potential difference between the wiring 12 and the node N2.

The transistor 102 has a function of controlling electrical continuity between the wiring 13 and the node N1, and a function of supplying the potential VSS of the wiring 13 to the node N1.

The capacitor 110 has a function of maintaining a potential difference between the wiring 12 and the node N1.

Next, a method for driving the basic circuit in FIG. 1A will be described with reference to a timing chart in FIG. 1B and FIGS. 2A to 2C.

Here, the description is made assuming that a high-level potential of the signal CK and the signal SP is a potential VDD (also referred to as second potential) and a low-level potential thereof is the potential VSS. Note that the potential VDD is higher than the potential VSS.

Furthermore, the description is made on the assumption that an initial potential of the node N1 is the potential VDD, an initial potential of the node N2 is the potential VSS, and an initial potential of the wiring 12 is the potential VSS. Note that when the initial potential of the node N2 is the potential VSS, the transistor 101 is off in the initial state.

For convenience of description, a period necessary for the operation is divided into a period Ta and a period Tb.

First, in the period Ta, the signal SP goes high and the signal CK goes low. When the signal SP goes high, the transistor 102 is turned on. When the transistor 102 is turned on, the potential VSS of the wiring 13 is supplied to the node N1. Thus, the potential of the node N1 decreases to the potential VSS. At this time, the capacitor 110 maintains a potential difference between the node N1 and the wiring 12 and the transistor 101 is off; consequently, the wiring 12 is floating. Thus, the potential of the wiring 12 decreases from the potential VSS as the potential of the node N1 decreases. Then, the transistor 101 is turned on when the potential of the wiring 12 becomes lower than a potential obtained by subtracting the threshold voltage of the transistor 101 from the potential (e.g., the potential VSS) of the node N2 (see FIG. 2A).

When the transistor 101 is turned on, the signal CK of the wiring 11 is supplied to the wiring 12. Since the signal CK is low, the potential of the wiring 12 increases to the potential VSS. At this time, the transistor 101 maintains a potential difference between the node N2 and the wiring 12, and the node N2 is floating. Thus, the potential of the node N2 rises as the potential of the wiring 12 rises. When the potential of the node N2 exceeds a potential obtained by adding the potential (e.g., the potential VSS) of the wiring 11 and the threshold voltage of the transistor 101, the transistor 101 is kept on. Consequently, the potential of the wiring 12 increases to the potential VSS. That is, the signal OUT becomes low (see FIG. 2B).

Then, in the period Tb, the signal SP goes low and the signal CK goes high. When the signal SP goes low, the transistor 102 is turned off. The transistor 101 remains on as described above, so that the signal CK of the wiring 11 continues to be supplied to the wiring 12. Since the signal CK is high, the potential of the wiring 12 increases from the potential VSS. At this time, the transistor 101 maintains a potential difference between the node N2 and the wiring 12, and the node N2 is kept floating. Consequently, the potential of the node N2 rises as the potential of the wiring 12 rises. When the potential of the node N2 exceeds a potential obtained by adding the potential (e.g., the potential VDD) of the wiring 11 and the threshold voltage of the transistor 101, the transistor 101 is kept on. Thus, the potential of the wiring 12 increases to the potential VDD. That is, the signal OUT becomes high (see FIG. 2C).

In the basic circuit in FIG. 1A, Vgs of the transistor 102 can be kept high in the period Ta, so that the drain current of the transistor 102 can be kept high. Thus, the potential of the node N1 can be rapidly decreased, whereby the period Ta can be shortened. In other words, the driving frequency can be increased.

Keeping Vgs of the transistor 102 high leads to the decrease in W/L of the transistor 102. Thus, advantages such as reduction in the layout area and decrease in the input capacitance are obtained.

A capacitor may be connected between the gate and the second terminal of the transistor 101, in which case the capacitance between the node N2 and the wiring 12 can be increased and as a result, the potential of the node N2 can be made higher.

In the period Tb, the signal SP may be kept high. In this case, the transistor 102 is kept on in the period Tb, so that the potential VSS of the wiring 13 continues to be supplied to the node N1. Consequently, the change in the potential of the node N1 associated with the change in the potential of the wiring 12 can be prevented.

Alternatively, in the period Tb, the signal SP may be kept high as in the period Ta and then become low. In this case, the transistor 102 remains on and then is turned off in the period Tb, so that the potential VSS of the wiring 13 continues to be supplied to the node N1 in a period during which the potential of the wiring 12 is changed within the period Tb. Thus, the change in the potential of the node N1 associated with the change in the potential of the wiring 12 can be prevented.

In the case where a load is connected to the wiring 12, the load is driven by the transistor 101. Therefore, W/L of the transistor 101 is preferably higher than that of the transistor 102.

A transistor may be used as the capacitor 110, in which case it is preferable that a gate of the transistor be connected to the node N1 and a first terminal and/or a second terminal of the transistor be connected to the wiring 12. In other words, the capacitor 110 may include a semiconductor layer connected to the wiring 12, a gate electrode connected to the node N1, and a gate insulating layer between the semiconductor layer and the gate electrode. Consequently, the capacitance between the node N1 and the wiring 12 can be large when the potential of the node N1 decreases in the period Ta.

The transistor 102 may be replaced with a switching element having a first terminal connected to the wiring 13 and a second terminal connected to the node N1.

Note that the high-level potential of the signal SP may be lower than the potential VDD, in which case the amplitude voltage of the signal SP can be reduced to cut power consumption.

The low-level potential of the signal SP may be lower than the potential VSS, in which case the transistor 102 can be definitely turned off even if the transistor 102 is a normally-on transistor.

Next, a sequential circuit including the basic circuit in FIG. 1A will be described.

First, the configuration of a sequential circuit in this embodiment will be described with reference to FIG. 3. The sequential circuit in FIG. 3 includes transistors 103 to 105 in addition to the basic circuit illustrated in FIG. 1A.

Note that the transistors 101 to 105 preferably have the same conductivity type. In this embodiment, the case where these transistors are n-channel transistors will be described.

A first terminal of the transistor 103 is connected to the wiring 13. A second terminal of the transistor 103 is connected to the wiring 12. A gate of the transistor 103 is connected to the node N1.

A first terminal of the transistor 104 is connected to the wiring 13. A second terminal of the transistor 104 is connected to the node N2. A gate of the transistor 104 is connected to the node N1.

A first terminal of the transistor 105 is connected to a wiring 15. A second terminal of the transistor 105 is connected to the node N1. A gate of the transistor 105 is connected to a wiring 16.

The wiring 15 (also referred to as power supply line) is supplied with the potential VDD and has a function of transmitting or supplying the potential VDD.

The wiring 16 (also referred to as signal line) is supplied with a signal RE and has a function of transmitting or supplying the signal RE. The signal RE is a signal having high and low levels. Further, the signal RE is a signal for controlling the on/off state of the transistor 105. The signal RE corresponds to, for example, a reset pulse input to a shift register circuit or an output signal of the following sequential circuit or any sequential circuit after the following sequential circuit.

The transistor 103 has a function of controlling electrical continuity between the wiring 13 and the wiring 12, and a function of supplying the potential VSS of the wiring 13 to the wiring 12.

The transistor 104 has a function of controlling electrical continuity between the wiring 13 and the node N2, and a function of supplying the potential VSS of the wiring 13 to the node N2.

The transistor 105 has a function of controlling electrical continuity between the wiring 15 and the node N1, and a function of supplying the potential VDD of the wiring 15 to the node N1.

Next, the operation of the sequential circuit in FIG. 3 will be described with reference to a timing chart in FIG. 4.

The following description is made assuming that a high-level potential of the signal CK, the signal SP, and the signal RE is the potential VDD and a low-level potential thereof is the potential VSS.

Furthermore, the description is made on the assumption that an initial potential of the node N1 is the potential VDD, an initial potential of the node N2 is the potential VSS, and an initial potential of the wiring 12 is the potential VSS. Since the initial potential of the node N2 is the potential VSS, the transistor 101 is off in the initial state.

For convenience of description, a period necessary for the operation is divided into periods Ta, Tb, Tc, and Td.

First, in the period Ta, the signal SP goes high, the signal RE goes low, and the signal CK goes low. When the signal RE goes low, the transistor 105 is turned off. When the signal SP goes high, the transistor 102 is turned on. When the transistor 102 is turned on, the potential VSS of the wiring 13 is supplied to the node N1. Thus, the potential of the node N1 decreases to the potential VSS. When the potential of the node N1 decreases, the transistors 103 and 104 are turned off. When the transistor 104 is turned off, the node N2 becomes floating. Thus, the potential of the node N2 remains at the potential VSS, so that the transistor 101 is kept off.

In a period during which the potential of the node N1 is decreasing, the capacitor 110 maintains a potential difference between the node N1 and the wiring 12, and the wiring 12 is floating since the transistors 101 and 103 are off. Thus, the potential of the wiring 12 decreases from the potential VSS as the potential of the node N1 decreases. The transistor 101 is turned on when the potential of the wiring 12 becomes lower than a potential obtained by subtracting the threshold voltage of the transistor 101 from the potential (e.g., the potential VSS) of the node N2. When the transistor 101 is turned on, the signal CK of the wiring 11 is supplied to the wiring 12. Since the signal CK is low, the potential of the wiring 12 increases. At this time, the transistor 101 maintains a potential difference between the node N2 and the wiring 12, and the node N2 is floating since the transistor 104 is off. Consequently, the potential of the node N2 rises as the potential of the wiring 12 rises. When the potential of the node N2 exceeds a potential obtained by adding the potential (e.g., the potential VSS) of the wiring 11 and the threshold voltage of the transistor 101, the transistor 101 is kept on. Thus, the potential of the wiring 12 increases to the potential VSS. That is, the signal OUT becomes low.

Then, in the period Tb, the signal SP goes low, the signal RE is kept low, and the signal CK goes high. Since the signal RE is kept low, the transistor 105 is kept off. The transistor 102 is turned off because the signal SP goes low. Thus, the node N1 becomes floating and the potential of the node N1 is kept at the potential in the period Ta, so that the transistors 103 and 104 remain off.

Here, since the transistor 101 is kept on, the signal CK of the wiring 11 continues to be supplied to the wiring 12. Since the signal CK is high, the potential of the wiring 11 rises. At this time, the transistor 101 maintains a potential difference between the node N2 and the wiring 12, and the node N2 is floating since the transistor 104 is off. Consequently, the potential of the node N2 rises as the potential of the wiring 12 rises. When the potential of the node N2 exceeds a potential obtained by adding the potential (e.g., the potential VDD) of the wiring 11 and the threshold voltage of the transistor 101, the transistor 101 is kept on. Thus, the potential of the wiring 12 increases to the potential VDD. That is, the signal OUT becomes high.

Then, in the period Tc, the signal SP is kept low, the signal RE goes high, and the signal CK goes low. The transistor 102 is kept off because the signal SP is kept low. The transistor 105 is turned on because the signal RE goes high. When the transistor 105 is turned on, the potential VDD of the wiring 15 is supplied to the node N1, so that the potential of the node N1 rises. Then, the transistor 105 is turned off when the potential of the node N1 increases to a potential obtained by subtracting the threshold voltage of the transistor 105 from the gate potential (e.g., the potential VDD) of the transistor 105. Thus, the node N1 becomes floating, and the potential of the node N1 remains high. When the potential of the node N1 increases, the transistors 103 and 104 are turned on. When the transistor 104 is turned on, the potential VSS of the wiring 13 is supplied to the node N2. Thus, the potential of the node N2 decreases to the potential VSS. When the potential of the node N2 decreases to the potential VSS, the transistor 101 is turned off. Further, when the transistor 103 is turned on, the potential VSS of the wiring 13 is supplied to the wiring 12. Thus, the potential of the wiring 12 decreases to the potential VSS. That is, the signal OUT becomes low.

Then, in the period Td, the signal SP is kept low, the signal RE goes low, and the signal CK oscillates between high and low levels. Since the signal SP is kept low, the transistor 102 is kept off. Since the signal RE goes low, the transistor 105 is kept off. The node N1 is kept floating because the transistors 102 and 105 remain off. Accordingly, the potential of the node N1 is kept at the potential in the period Tc, so that the transistors 103 and 104 are kept on. The potential VSS of the wiring 13 continues to be supplied to the node N2 while the transistor 104 is kept on. Thus, the potential of the node N2 remains at the potential VSS, and the transistor 101 remains off. Further, the potential VSS of the wiring 13 continues to be supplied to the wiring 12 while the transistor 103 is kept on. Thus, the potential of the wiring 12 remains at the potential VSS. That is, the signal OUT remains low.

Figure 3:
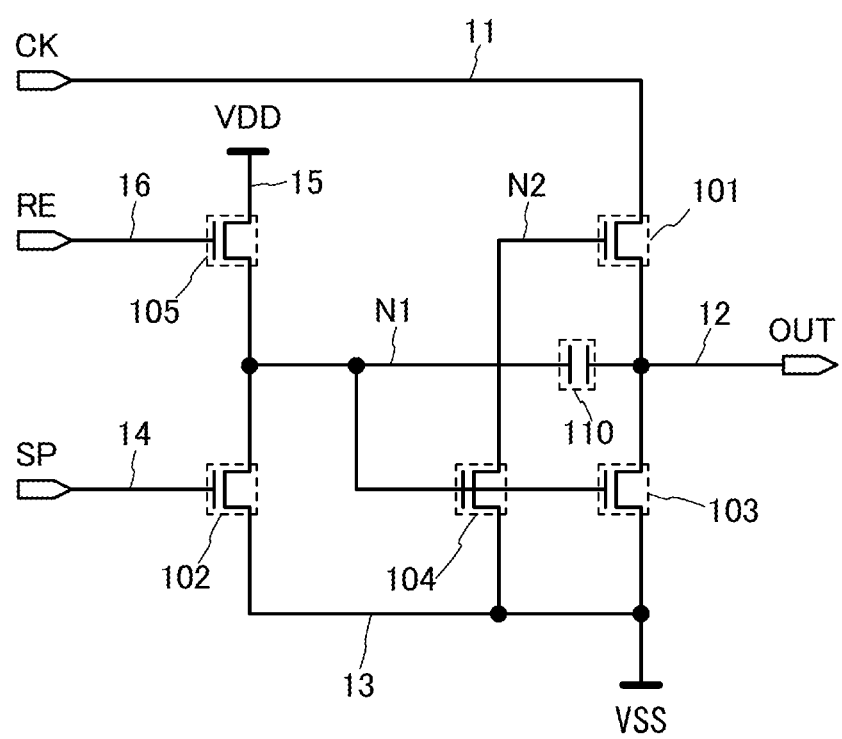
FIG. 3 illustrates a sequential circuit according to one embodiment of the present invention.
Figure 4:
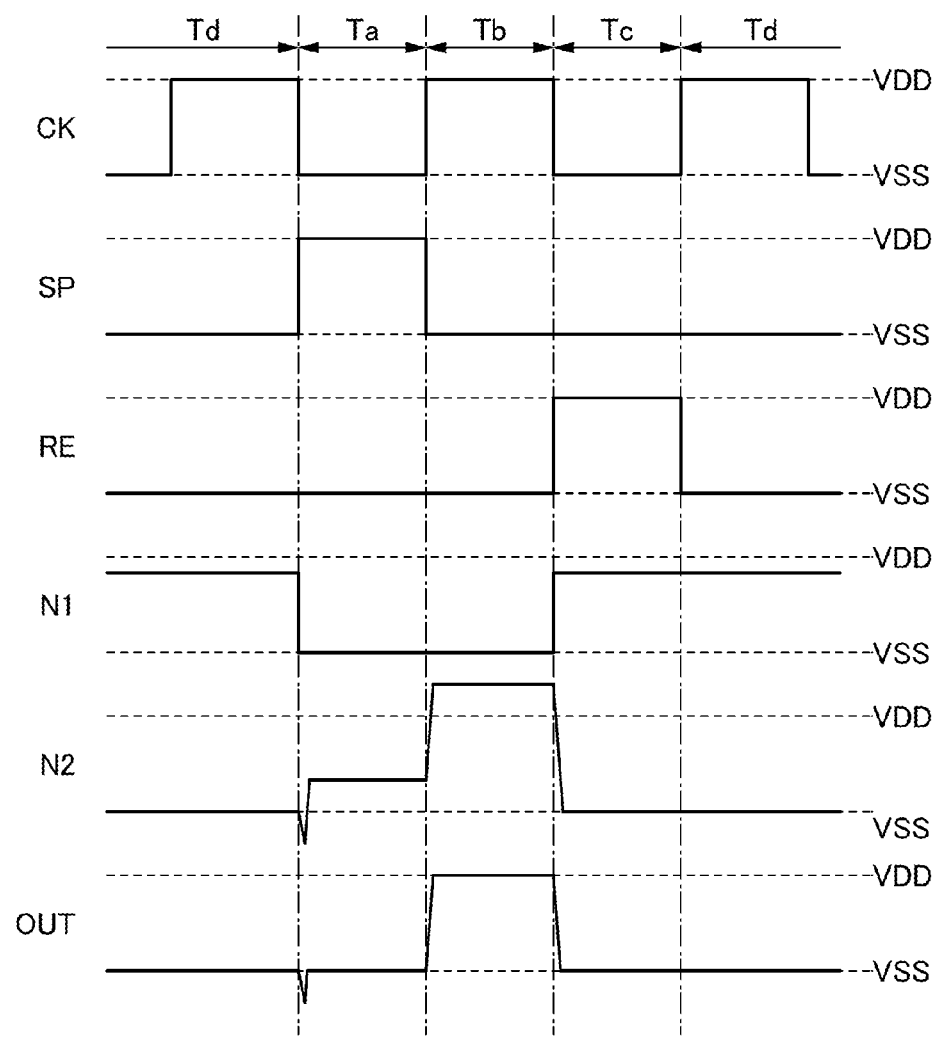
FIG. 4 is a diagram for explaining a sequential circuit according to one embodiment of the present invention.

In the sequential circuit in FIG. 3, the potential of the wiring 12 becomes lower than the potential VSS in the period Ta, so that the source and the drain of the transistor 103 can interchange with each other. As a result, deterioration of the transistor 103 can be suppressed.

The sequential circuit in FIG. 3 can have advantageous effects similar to those of the above basic circuit.

In the case where a load is connected to the wiring 12, the load is driven by the transistors 101 and 103. Therefore, W/L of the transistor 101 is preferably higher than that of the transistors 102, 104, and 105. Moreover, W/L of the transistor 103 is preferably higher than that of the transistors 102, 104, and 105.

Both the transistor 101 and the transistor 103 supply charge to the wiring 12. Note that Vgs of the transistor 101 in the period Tb is often lower than Vgs of the transistor 103 in the period Tc; therefore, W/L of the transistor 101 is preferably higher than that of the transistor 103.

Both the transistor 102 and the transistor 105 supply charge to the node N1. Note that Vgs of the transistor 105 in the period Tc decreases gradually, whereas Vgs of the transistor 102 in the period Ta is kept high. Therefore, W/L of the transistor 105 is preferably higher than that of the transistor 102.

Note that W/L of the transistor 102 is preferably higher than that of the transistor 104.

Note that the high-level potential of the signal RE may be higher than the potential VDD. In this case, the transistor 105 can be prevented from being turned off in the period Tc, so that the potential of the node N1 can increase to the potential VDD.

The low-level potential of the signal RE may be lower than the potential VSS, in which case the transistor 105 can be definitely turned off even if the transistor 105 is a normally-on transistor.

The wiring 15 may be supplied with a potential lower than the potential VDD.

The transistor 103 may be replaced with a switching element having a first terminal connected to the wiring 13 and a second terminal connected to the wiring 12.

The transistor 104 may be replaced with a switching element having a first terminal connected to the wiring 13 and a second terminal connected to the node N2.

The transistor 105 may be replaced with a switching element having a first terminal connected to the wiring 15 and a second terminal connected to the node N1.

Next, a shift register circuit including the sequential circuit in FIG. 3 will be described.

First, the configuration of a shift register circuit in this embodiment will be described with reference to FIG. 5. The shift register circuit in FIG. 5 includes N sequential circuits 100 (N: a natural number). For convenience, FIG. 5 only shows first to third sequential circuits 100 (indicated by 100[1] to 100[3]) among the N sequential circuits 100.

The shift register circuit is connected to N wirings 21 (indicated by 21[1] to 21[N]), a wiring 22, a wiring 23, and a wiring 24. Specifically, in the i-th sequential circuit 100 (i: any one of 2 to N−1), the first terminal of the transistor 101 is connected to the wiring 22 or the wiring 23; the second terminal of the transistor 101 is connected to the wiring 21[i]; the gate of the transistor 102 is connected to the wiring 21[i−1]; and the gate of the transistor 105 is connected to the wiring 21[i+1].

The connection in the first sequential circuit 100 is similar to that in the i-th sequential circuit 100 except that there is no counterpart of the wiring 21 to which the gate of the transistor 102 is connected because there is no preceding sequential circuit 100. Hence, in the first sequential circuit 100, the gate of the transistor 102 is connected to the wiring 24.

The connection in the N-th sequential circuit 100 is similar to that in the i-th sequential circuit 100 except that there is no counterpart of the wiring 21 to which the gate of the transistor 105 is connected because there is no following sequential circuit 100. Hence, in the N-th sequential circuit 100, the gate of the transistor 105 is connected to the wiring 24. Alternatively, in the N-th sequential circuit 100, the gate of the transistor 105 may be connected to, for example, a wiring supplied with a reset pulse or an output of a dummy circuit provided following the N-th sequential circuit 100.

In the case where the first terminal of the transistor 101 in the odd-numbered sequential circuit 100 is connected to one of the wirings 22 and 23, the first terminal of the transistor 101 in the even-numbered sequential circuit 100 is connected to the other of the wirings 22 and 23.

The wiring 21 (also referred to as signal line) outputs a signal SOUT and has a function of transmitting or supplying the signal SOUT. In the i-th sequential circuit 100, the i-th wiring 21 corresponds to the wiring 12, the (i−1)th wiring 21 corresponds to the wiring 14, and the (i+1)th wiring 21 corresponds to the wiring 16. The signal SOUT output from the i-th wiring 21 corresponds to the signal OUT, the signal SOUT output from the (i−1)th wiring 21 corresponds to the signal SP, and the signal SOUT output from the (i+1)th wiring 21 corresponds to the signal RE.

The wiring 22 (also referred to as signal line) is supplied with a signal SCK and has a function of transmitting or supplying the signal SCK. In one of the odd-numbered sequential circuit 100 and the even-numbered sequential circuit 100, the wiring 22 corresponds to the wiring 11 and the signal SCK corresponds to the signal CK.

The wiring 23 (also referred to as signal line) is supplied with a signal SCKB and has a function of transmitting or supplying the signal SCKB. In the other of the odd-numbered sequential circuit 100 and the even-numbered sequential circuit 100, the wiring 23 corresponds to the wiring 11 and the signal SCKB corresponds to the signal CK. Note that the signal SCKB is an inverted signal of the signal SCK or a signal that is out of phase with the signal SCK.

The wiring 24 (also referred to as signal line) is supplied with a signal SSP and has a function of transmitting or supplying the signal SSP. In the first sequential circuit 100, the wiring 24 corresponds to the wiring 14 and the signal SSP corresponds to the signal SP.

Figure 5:
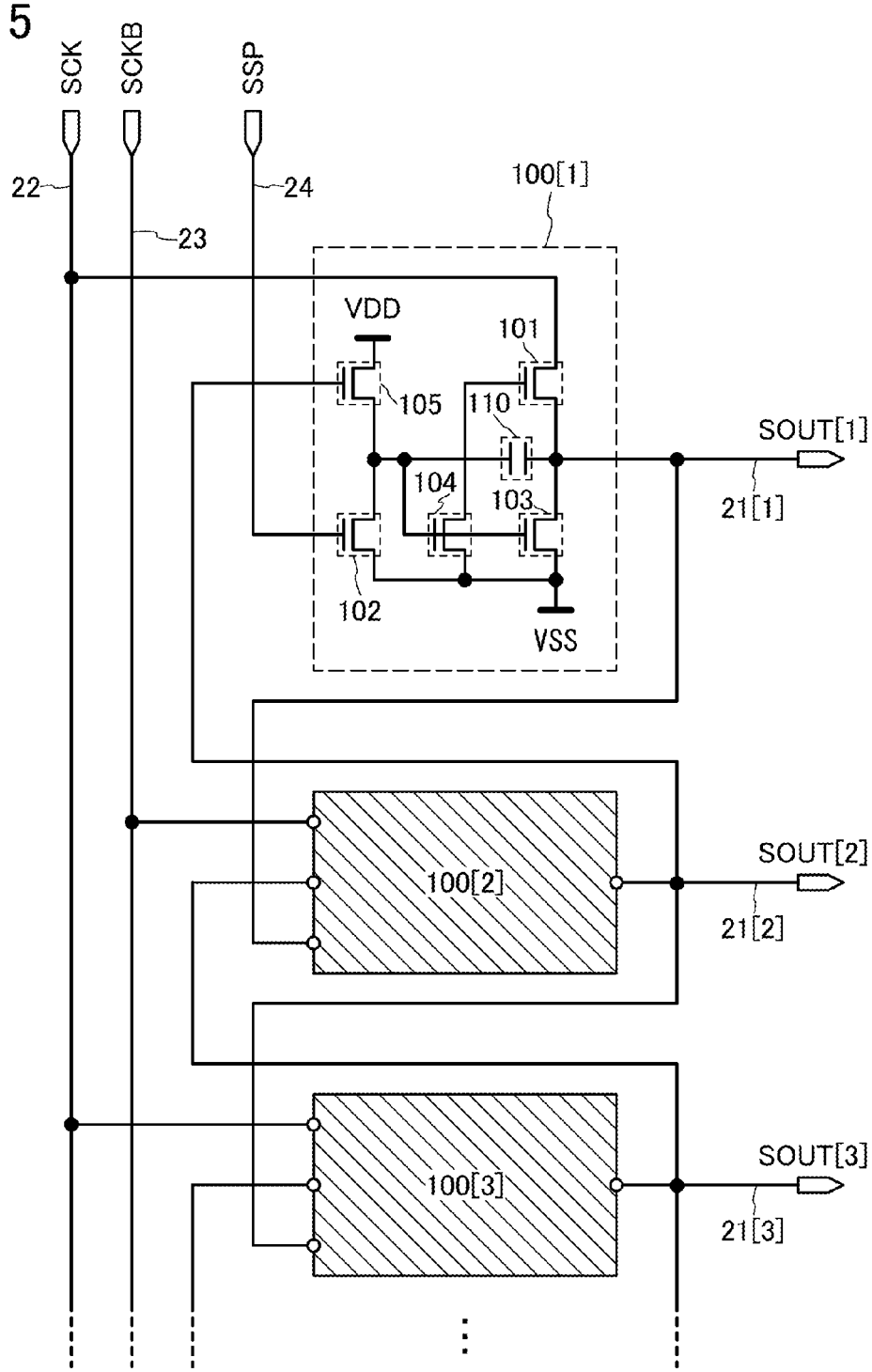
FIG. 5 illustrates a shift register circuit according to one embodiment of the present invention.

The shift register circuit in FIG. 5 can have advantageous effects similar to those of the above-described basic circuit or sequential circuit.

Note that in the i-th sequential circuit 100, the gate of the transistor 102 may be connected to the (i−2)th wiring 21 or the (i−3)th wiring 21.

In the i-th sequential circuit 100, the gate of the transistor 105 may be connected to the (i+2)th wiring 21 or the (i+3)th wiring 21.

This embodiment can be implemented in combination with any other embodiment as appropriate.

(Embodiment 2)

In this embodiment, a basic circuit including a buffer circuit and a sequential circuit including the basic circuit will be described.

First, the configuration of a basic circuit in this embodiment will be described with reference to FIG. 6A. The basic circuit in FIG. 6A has a configuration in which a transistor 201 is provided in the basic circuit in FIG. 1A.

Note that the transistor 201 preferably has the same conductivity type as the transistor 101. In this embodiment, the case where these transistors are n-channel transistors will be described.

A first terminal of the transistor 201 is connected to the wiring 11. A second terminal of the transistor 201 is connected to a wiring 31. A gate of the transistor 201 is connected to the gate of the transistor 101.

The transistor 201 has a function of controlling electrical continuity between the wiring 11 and the wiring 31, a function of supplying the signal CK of the wiring 11 to the wiring 31, and a function of maintaining a potential difference between the wiring 31 and the node N2.

The wiring 31 (also referred to as signal line) outputs a signal BOUT and has a function of transmitting or supplying the signal BOUT. The signal BOUT is a signal having high and low levels. Moreover, the signal BOUT is an output signal of the basic circuit in FIG. 6A. The signal BOUT corresponds to one of a plurality of output signals output from a shift register circuit or an output signal of a sequential circuit.

Next, a method for driving the basic circuit in FIG. 6A will be described.

Note that the description common to the method for driving the basic circuit in FIG. 1A is omitted.

The following description is made assuming that an initial potential of the wiring 31 is the potential VSS.

For convenience, the assumption is made that when the potential of the node N2 becomes a potential with which the transistor 101 is turned on, the transistor 201 is also turned on.

First, in the period Ta, the potential of the node N2 exceeds a potential obtained by adding the potential (e.g., the potential VSS) of the wiring 11 and the threshold voltage of the transistor 101. Thus, the transistor 201 is turned on, so that the signal CK of the wiring 11 is supplied to the wiring 31. Since the signal CK is low, the potential of the wiring 31 is kept at the potential VSS. That is, the signal BOUT becomes low.

Then, in the period Tb, the potential of the node N2 exceeds a potential obtained by adding the potential (e.g., the potential VDD) of the wiring 11 and the threshold voltage of the transistor 101. Thus, the transistor 201 is kept on, so that the signal CK of the wiring 11 continues to be supplied to the wiring 31. Since the signal CK is high, the potential of the wiring 31 increases to the potential VDD. That is, the signal BOUT becomes high.

Figure 6A:
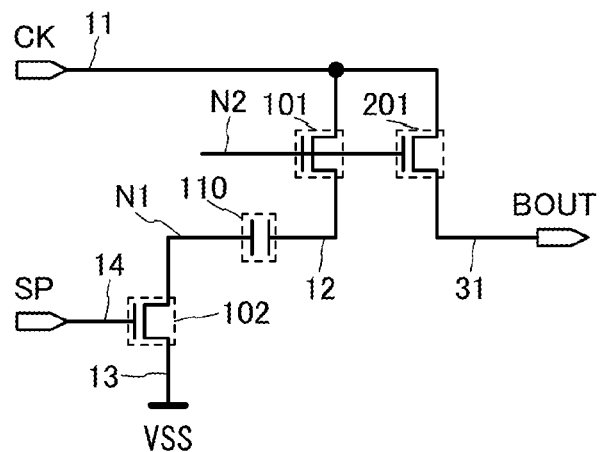
FIGS. 6A and 6B illustrate a basic circuit and a sequential circuit, respectively, according to one embodiment of the present invention.

In the basic circuit in FIG. 6A, the potential of the wiring 31 can be prevented from decreasing from the potential VSS in a period during which the signal SP is high. Accordingly, the basic circuit in FIG. 6A can output a more stable signal.

The basic circuit in FIG. 6A can have advantageous effects similar to those of the basic circuit in Embodiment 1.

In the case where a load is connected to the wiring 31, the load is driven by the transistor 201. The load connected to the wiring 31 is often larger than a load connected to the wiring 12. Therefore, W/L of the transistor 201 is preferably higher than that of the transistor 101.

The first terminal of the transistor 101 and the first terminal of the transistor 201 may be connected to different wirings.

Next, a sequential circuit including the basic circuit in FIG. 6A will be described.

First, the configuration of a sequential circuit in this embodiment will be described with reference to FIG. 6B. The sequential circuit in FIG. 6B has a configuration in which the transistor 201 and a transistor 202 are provided in the sequential circuit in FIG. 3.

Note that the transistors 201 and 202 preferably have the same conductivity type as the transistor 101. In this embodiment, the case where these transistors are n-channel transistors will be described.

The first terminal of the transistor 201 is connected to the wiring 11. The second terminal of the transistor 201 is connected to the wiring 31. The gate of the transistor 201 is connected to the gate of the transistor 101.

A first terminal of the transistor 202 is connected to the wiring 13. A second terminal of the transistor 202 is connected to the wiring 31. A gate of the transistor 202 is connected to the node N1.

The transistor 202 has a function of controlling electrical continuity between the wiring 13 and the wiring 31, and a function of supplying the potential VSS of the wiring 13 to the wiring 31.

Next, a method for driving the sequential circuit in FIG. 6B will be described.

Note that the description common to the method for driving the sequential circuit in FIG. 3 is omitted.

The following description is made assuming that an initial potential of the wiring 31 is the potential VSS.

For convenience, the assumption is made that when the potential of the node N2 becomes a potential with which the transistor 101 is turned on, the transistor 201 is also turned on.

Further, for convenience, the assumption is made that when the potential of the node N1 becomes a potential with which the transistor 103 is turned on, the transistor 202 is also turned on.

First, in the period Ta, the potential of the node N1 becomes the potential VSS, so that the transistor 202 is turned off. Moreover, the potential of the node N2 exceeds a potential obtained by adding the potential (e.g., the potential VSS) of the wiring 11 and the threshold voltage of the transistor 101. Thus, the transistor 201 is turned on, so that the signal CK of the wiring 11 is supplied to the wiring 31. Since the signal CK is low, the potential of the wiring 31 is kept at the potential VSS. That is, the signal BOUT becomes low.

Then, in the period Tb, the potential of the node N1 is kept at the potential in the period Ta, whereby the transistor 202 is kept off. Further, the potential of the node N2 exceeds a potential obtained by adding the potential (e.g., the potential VDD) of the wiring 11 and the threshold voltage of the transistor 101. Thus, the transistor 201 is turned on, so that the signal CK of the wiring 11 continues to be supplied to the wiring 31. Since the signal CK is high, the potential of the wiring 31 increases to the potential VDD. That is, the signal BOUT becomes high.

Then, in the period Tc, the potential of the node N2 becomes the potential VSS, so that the transistor 201 is turned off. Moreover, the potential of the node N1 increases to a potential obtained by subtracting the threshold voltage of the transistor 105 from the gate potential (e.g., the potential VDD) of the transistor 105. Thus, the transistor 202 is turned on, whereby the potential of the wiring 13 is supplied to the wiring 31. Consequently, the potential of the wiring 31 decreases to the potential VSS. That is, the signal BOUT becomes low.

Then, in the period Td, the potential of the node N2 is kept at the potential VSS, so that the transistor 201 remains off. Moreover, the potential of the node N1 is kept at the potential in the period Tc. Thus, the transistor 202 is kept on, whereby the potential of the wiring 13 continues to be supplied to the wiring 31. Consequently, the potential of the wiring 31 is kept at the potential VSS. That is, the signal BOUT remains low.

Figure 6B:
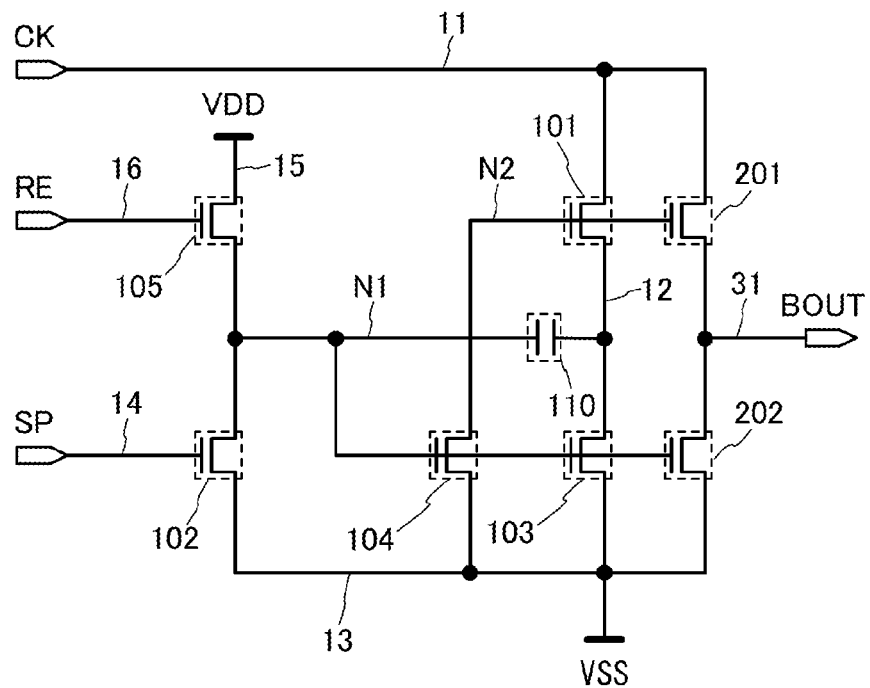

The sequential circuit in FIG. 6B can have advantageous effects similar to those of the above basic circuit, and the basic circuit and the sequential circuit in Embodiment 1.

In the case where a load is connected to the wiring 31, the load is driven by the transistor 201. The load connected to the wiring 31 is often larger than a load connected to the wiring 12. Therefore, W/L of the transistor 202 is preferably higher than that of the transistor 103.

Both the transistor 201 and the transistor 202 supply charge to the wiring 31. Note that Vgs of the transistor 201 in the period Tb is often lower than Vgs of the transistor 202 in the period Tc; therefore, W/L of the transistor 201 is preferably higher than that of the transistor 202.

The transistor 202 may be replaced with a switching element having a first terminal connected to the wiring 13 and a second terminal connected to the wiring 31.

This embodiment can be implemented in combination with any other embodiment as appropriate.

(Embodiment 3)

In this embodiment, sequential circuits different from those in Embodiments 1 and 2 will be described.

Figure 7A:
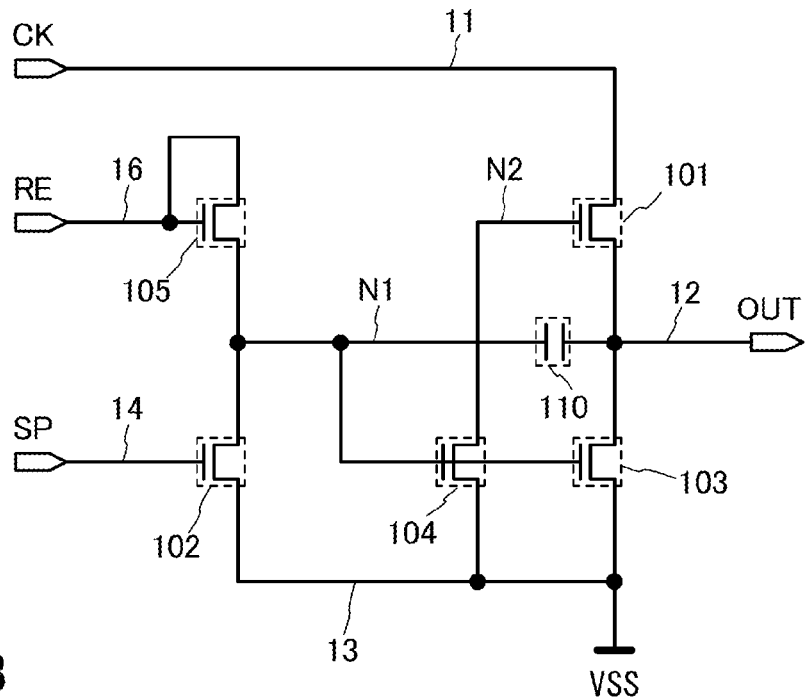
FIGS. 7A and 7B each illustrate a sequential circuit according to one embodiment of the present invention.

A sequential circuit in FIG. 7A has a configuration in which the second terminal of the transistor 105 is connected to the wiring 16 in the sequential circuit in FIG. 3.

In the sequential circuit in FIG. 7A, the wiring 15 and the potential VDD can be omitted.

Note that in any of the sequential circuits and the shift register circuit described in Embodiments 1 and 2, the second terminal of the transistor 105 may be connected to the wiring 16.

Figure 7B:
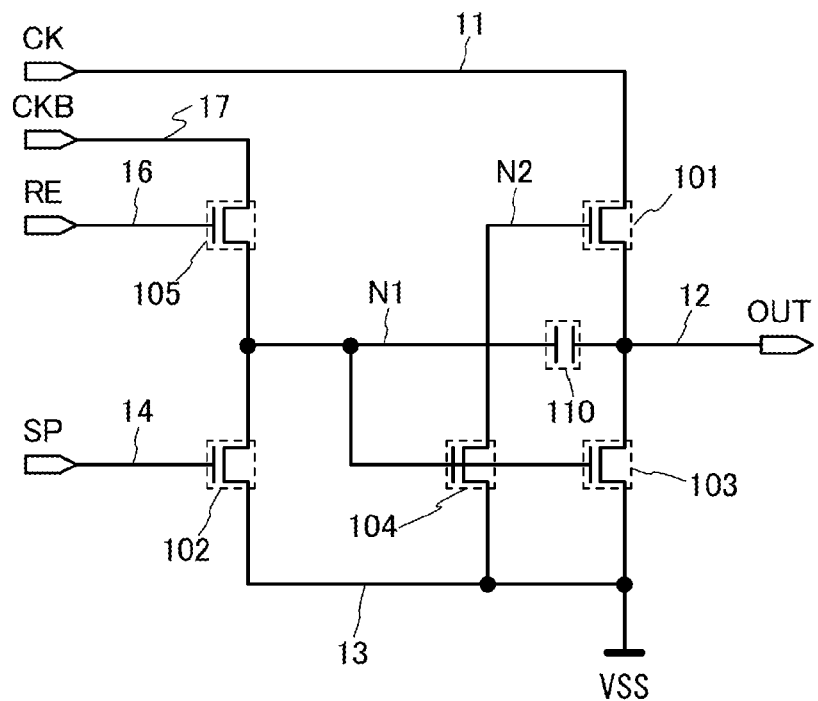

A sequential circuit in FIG. 7B has a configuration in which the second terminal of the transistor 105 in the sequential circuit in FIG. 3 is connected to a wiring 17.

The wiring 17 (also referred to as signal line) is supplied with a signal CKB and has a function of transmitting or supplying the signal CKB. The signal CKB is a signal having high and low levels. The signal CKB corresponds to one of a plurality of clock signals input to a shift register circuit. Moreover, the signal CKB is an inverted signal of the signal CK or a signal that is out of phase with the signal CK.

In the sequential circuit in FIG. 7B, the wiring 15 and the potential VDD can be omitted.

Note that in any of the sequential circuits and the shift register circuit described in Embodiments 1 and 2, the second terminal of the transistor 105 may be connected to the wiring 17.

Figure 8A:
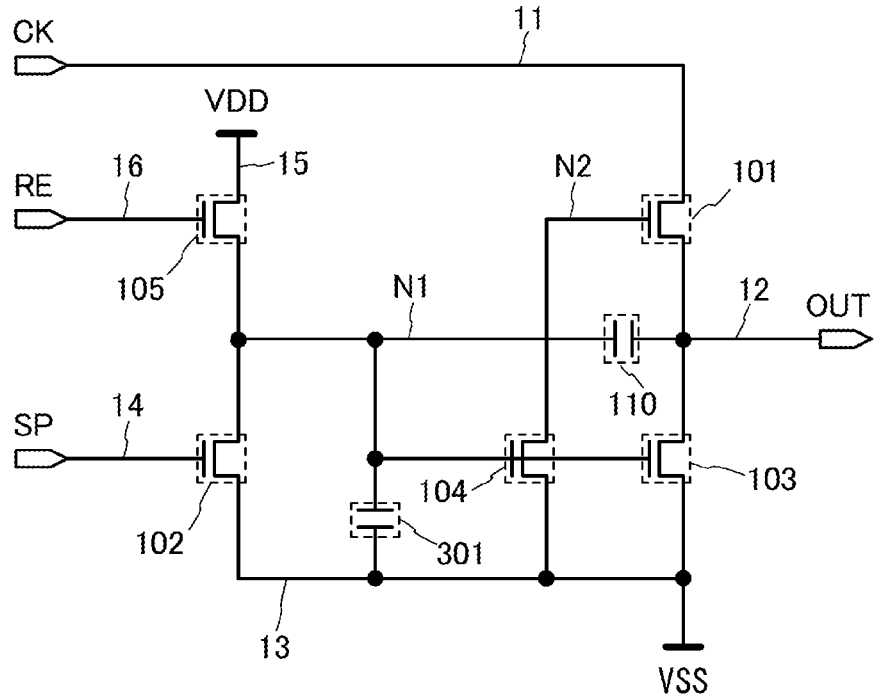
FIGS. 8A and 8B each illustrate a sequential circuit according to one embodiment of the present invention.

A sequential circuit in FIG. 8A has a configuration in which a capacitor 301 is provided in the sequential circuit in FIG. 3.

A first electrode of the capacitor 301 is connected to the wiring 13. A second electrode of the capacitor 301 is connected to the node N1.

The capacitor 301 has a function of maintaining a potential difference between the wiring 13 and the node N1, and a function of maintaining the potential of the node N1.

In the period Ta, the capacitor 301 maintains a potential difference between the wiring 13 and the node N1 at the time when the potential VSS of the wiring 13 is supplied to the node N1.

In the period Tb, the capacitor 301 holds the voltage in the period Ta.

In the period Tc, the capacitor 301 maintains a potential difference between the wiring 13 and the node N1 at the time when the potential VDD of the wiring 15 is supplied to the node N1.

In the period Td, the capacitor 301 holds the voltage in the period Tc.

In the sequential circuit in FIG. 8A, the rise in the potential of the node N1 associated with the rise in the potential of the wiring 12 can be suppressed because the capacitor 301 maintains a potential difference between the wiring 13 and the node N1 in the period Tb.

Furthermore, the change in the potential of the node N1 can be suppressed because the capacitor 301 maintains a potential difference between the wiring 13 and the node N1 in the period Td.

Note that the first electrode of the capacitor 301 is not limited to being connected to the wiring 13 and may be connected to the wiring 11, the wiring 14, the wiring 15, or the wiring 16, for example.

Note that the capacitor 301 may be provided in any of the basic circuits, the sequential circuits, and the shift register circuit described in Embodiments 1 to 3.

Figure 8B:
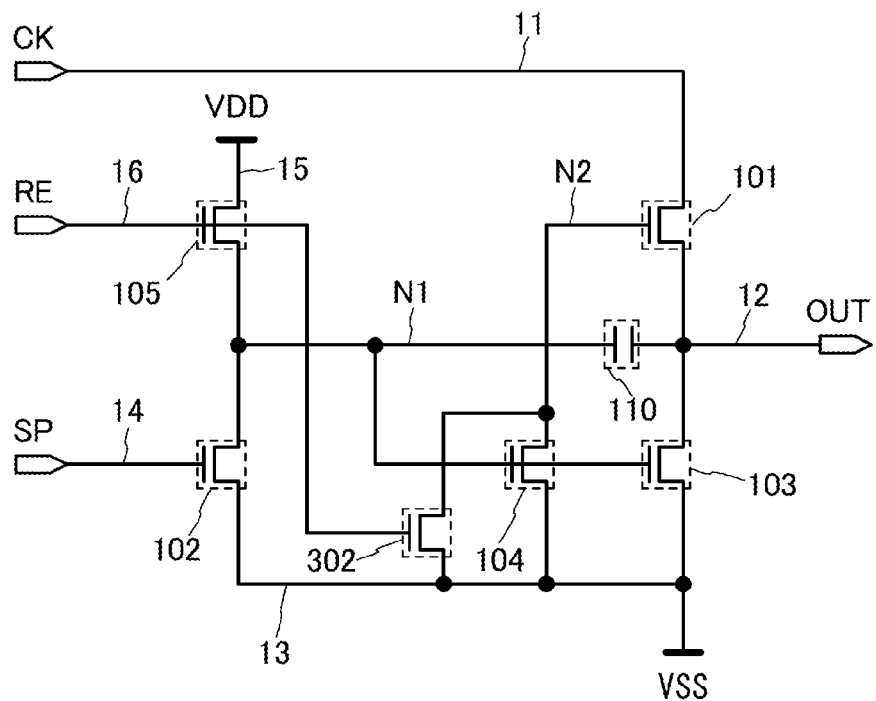

A sequential circuit in FIG. 8B has a configuration in which a transistor 302 is provided in the sequential circuit in FIG. 3.

Note that the transistor 302 preferably has the same conductivity type as the transistor 101. In this embodiment, the case where these transistors are n-channel transistors will be described.

A first terminal of the transistor 302 is connected to the wiring 13. A second terminal of the transistor 302 is connected to the node N2. A gate of the transistor 302 is connected to the wiring 16.

The transistor 302 has a function of controlling electrical continuity between the wiring 13 and the node N2, and a function of supplying the potential VSS of the wiring 13 to the node N2.

In the period Ta, the period Tb, and the period Td, the signal RE is low; thus, the transistor 302 is off.

In the period Tc, the signal RE goes high. When the signal RE goes high, the transistor 302 is turned on, and the potential VSS of the wiring 13 is supplied to the node N2.

Since the sequential circuit in FIG. 8B includes the transistor 302, the timing at which the potential VSS of the wiring 13 starts to be supplied to the node N2 can be advanced in the period Tc. Thus, the timing at which the potential of the node N2 starts to fall can be advanced, so that the timing at which the transistor 101 is turned off can be advanced.

Note that the transistor 302 may be provided in any of the basic circuits, the sequential circuits, and the shift register circuit described in Embodiments 1 to 3.

The transistor 302 may be replaced with a switching element having a first terminal connected to the wiring 13 and a second terminal connected to the node N2.

Figure 9A:
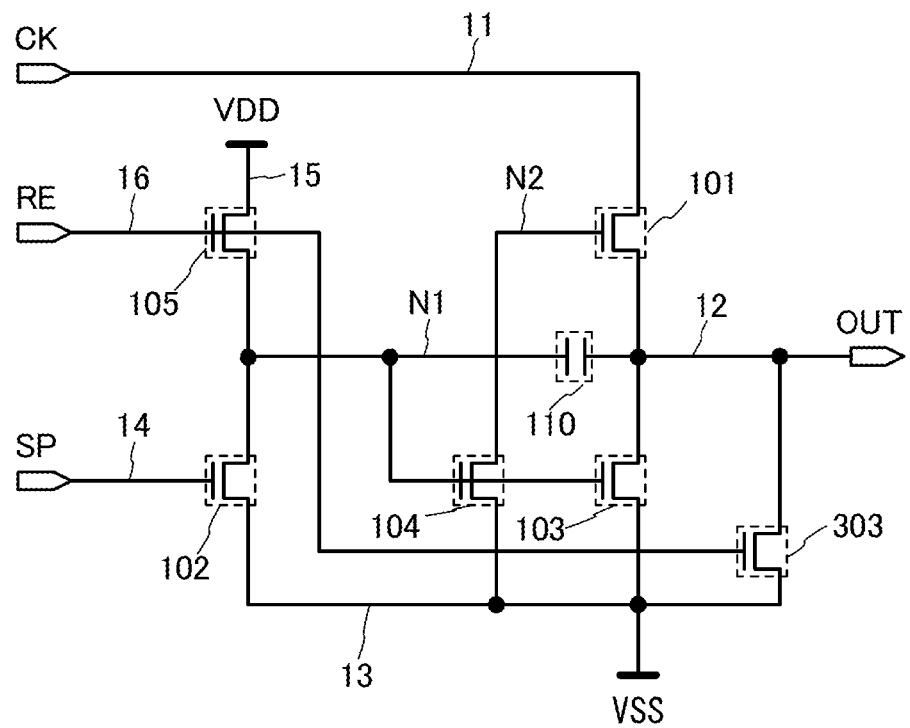
FIGS. 9A and 9B each illustrate a sequential circuit according to one embodiment of the present invention.

A sequential circuit in FIG. 9A has a configuration in which a transistor 303 is provided in the sequential circuit in FIG. 3.

A first terminal of the transistor 303 is connected to the wiring 13. A second terminal of the transistor 303 is connected to the wiring 12. A gate of the transistor 303 is connected to the wiring 16.

Note that the transistor 303 preferably has the same conductivity type as the transistor 101. In this embodiment, the case where these transistors are n-channel transistors will be described.

The transistor 303 has a function of controlling electrical continuity between the wiring 13 and the wiring 12, and a function of supplying the potential VSS of the wiring 13 to the wiring 12.

In the period Ta, the period Tb, and the period Td, the signal RE is low; thus, the transistor 303 is off.

In the period Tc, the signal RE goes high. When the signal RE goes high, the transistor 303 is turned on, and the potential VSS of the wiring 13 is supplied to the wiring 12.

Since the sequential circuit in FIG. 9A includes the transistor 303, the timing at which the potential VSS of the wiring 13 starts to be supplied to the wiring 12 can be advanced in the period Tc. As a result, the fall time of the signal OUT can be shortened.

Note that the transistor 303 may be provided in any of the basic circuits, the sequential circuits, and the shift register circuit described in Embodiments 1 to 3.

In the case where the transistor 303 is provided particularly in the basic circuit and the sequential circuit described in Embodiment 2, the second terminal of the transistor 303 may be connected to the wiring 31. Alternatively, in addition to the transistor 303, a transistor may be provided so that its first terminal is connected to the wiring 13, its second terminal is connected to the wiring 31, and its gate is connected to the wiring 16. As a result, the fall time of the signal BOUT can be shortened.

The transistor 303 may be replaced with a switching element having a first terminal connected to the wiring 13 and a second terminal connected to the wiring 12 or the wiring 31.

Figure 9B:
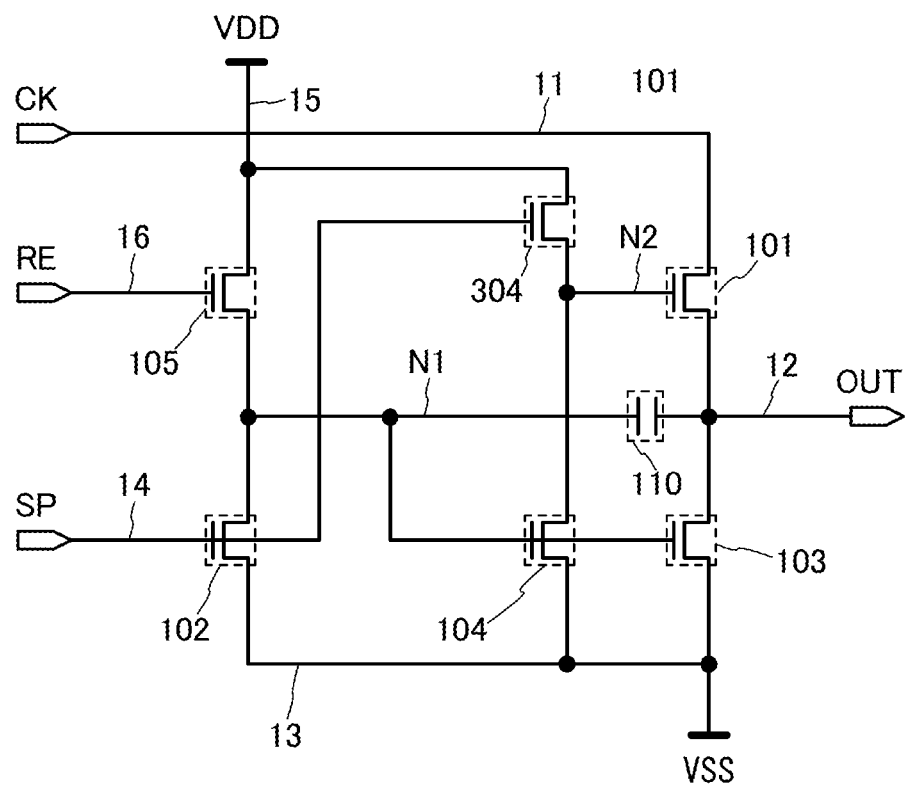

A sequential circuit in FIG. 9B has a configuration in which a transistor 304 is provided in the sequential circuit in FIG. 3.

Note that the transistor 304 preferably has the same conductivity type as the transistor 101. In this embodiment, the case where these transistors are n-channel transistors will be described.

A first terminal of the transistor 304 is connected to the wiring 15. A second terminal of the transistor 304 is connected to the node N2. A gate of the transistor 304 is connected to the wiring 14.

The transistor 304 has a function of controlling electrical continuity between the wiring 15 and the node N2, a function of supplying the potential VDD of the wiring 15 to the node N2, and a function of raising the potential of the node N2 and then stopping supply of charge, a potential, a signal, or the like to the node N2.

In the period Ta, the signal SP goes high. When the signal SP goes high, the transistor 304 is turned on. When the transistor 304 is turned on, the potential VDD of the wiring 15 is supplied to the node N2. Thus, the potential of the node N2 rises. When the potential of the node N2 becomes a potential obtained by subtracting the threshold voltage of the transistor 304 from the gate potential (e.g., the potential VDD) of the transistor 304, the transistor 304 is turned off. When the transistor 304 is turned off, the node N2 becomes floating.

In the periods Tb, Tc, and Td, the signal SP is low. The transistor 304 is turned off when the signal SP goes low.

The sequential circuit in FIG. 9B includes the transistor 304, whereby the potential of the node N2 can be definitely increased in the period Ta. That is, the transistor 101 can be definitely turned on.

Note that the transistor 304 may be provided in any of the basic circuits, the sequential circuits, and the shift register circuit described in Embodiments 1 to 3.

Note that the first terminal of the transistor 304 may be connected to the wiring 11, the wiring 14, or the wiring 17, for example.

The transistor 304 may be replaced with a switching element having a first terminal connected to the wiring 15 or the wiring 11 and a second terminal connected to the node N2.

Figure 10A:
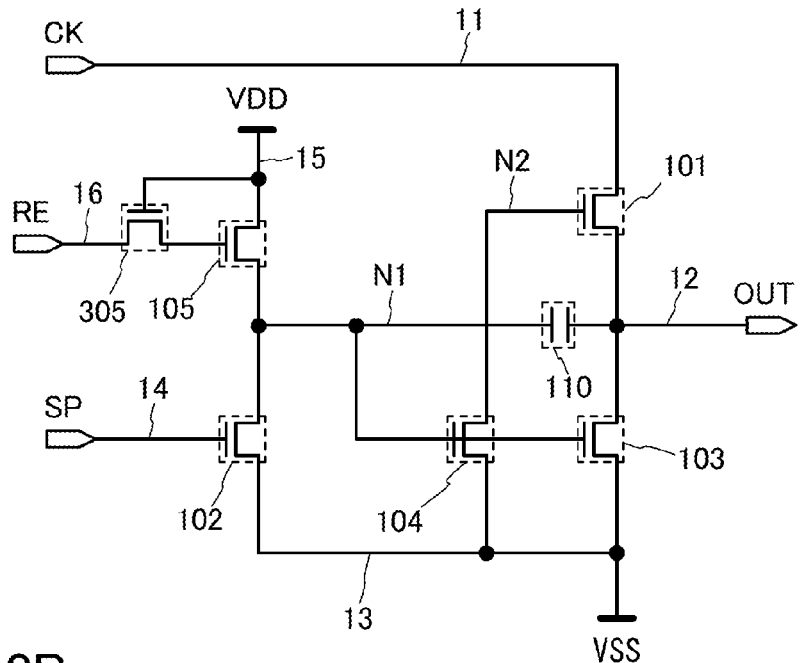
FIGS. 10A and 10B each illustrate a sequential circuit according to one embodiment of the present invention.

A sequential circuit in FIG. 10A has a configuration in which a transistor 305 is provided in the sequential circuit in FIG. 3.

Note that the transistor 305 preferably has the same conductivity type as the transistor 101. In this embodiment, the case where these transistors are n-channel transistors will be described.

A first terminal of the transistor 305 is connected to the wiring 16. A second terminal of the transistor 305 is connected to the gate of the transistor 105. A gate of the transistor 305 is connected to the wiring 15.

The transistor 305 has a function of controlling electrical continuity between the wiring 16 and the gate of the transistor 105, a function of supplying the signal RE of the wiring 16 to the gate of the transistor 105, and a function of raising the gate potential of the transistor 105 and then stopping supply of charge, a signal, a potential, or the like to the gate of the transistor 105.

In the period Ta, the period Tb, and the period Td, the transistor 305 is on. When the transistor 305 is turned on, the signal RE of the wiring 16 is supplied to the gate of the transistor 105. Since the signal RE is low, the gate potential of the transistor 305 becomes the potential VSS.

In the period Tc, the transistor 305 is turned on. When the transistor 305 is turned on, the signal RE of the wiring 16 is supplied to the gate of the transistor 105. Since the signal RE is high, the gate potential of the transistor 105 rises. When the gate potential of the transistor 105 rises, the transistor 105 is turned on. When the transistor 105 is turned on, the potential VDD of the wiring 15 is supplied to the node N1 and the potential of the node N1 rises as a result. When the gate potential of the transistor 105 becomes a potential obtained by subtracting the threshold voltage of the transistor 305 from the gate potential (e.g., the potential VDD) of the transistor 305, the transistor 305 is turned off. Thus, the gate of the transistor 105 becomes floating. At this time, a potential difference between the gate of the transistor 105 and the node N1 is maintained between the gate and the second terminal of the transistor 105. Accordingly, the gate potential of the transistor 105 rises as the potential of the node N1 rises. The transistor 105 is kept on when the gate potential of the transistor 105 exceeds a potential obtained by adding the potential VDD of the wiring 15 and the threshold voltage of the transistor 105. Thus, the potential of the node N1 becomes the potential VDD.

The sequential circuit in FIG. 10A includes the transistor 305, whereby the potential of the node N1 can increase to the potential VDD in the period Tc. Thus, Vgs of the transistors 103 and 104 can be increased, which makes it possible to turn on the transistors 103 and 104 more definitely.

Note that the transistor 305 may be provided in any of the basic circuits, the sequential circuits, and the shift register circuit described in Embodiments 1 to 3.

The transistor 305 may be replaced with a switching element having a first terminal connected to the wiring 16 and a second terminal connected to the gate of the transistor 105.

Note that it is possible to provide a capacitor having a first electrode connected to the gate of the transistor 105 and a second electrode connected to the second terminal of the transistor 105. Accordingly, the capacitance between the gate and the second terminal of the transistor 105 can be increased, so that the gate potential of the transistor 105 can be further increased.

Note also that the gate of the transistor 305 may be connected to the wiring 17.

Figure 10B:
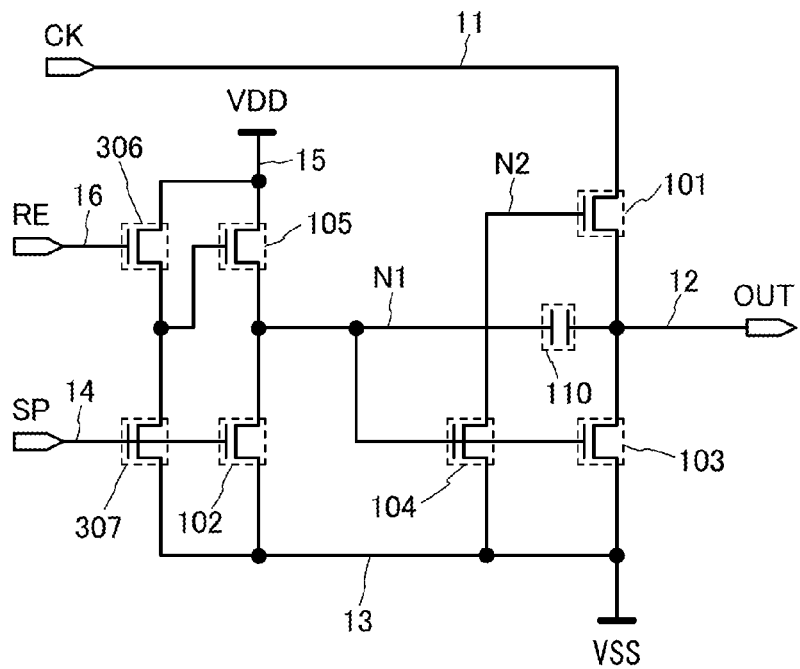

A sequential circuit in FIG. 10B has a configuration in which a transistor 306 and a transistor 307 are provided in the sequential circuit in FIG. 3.

Note that the transistors 306 and 307 preferably have the same conductivity type as the transistor 101. In this embodiment, the case where these transistors are n-channel transistors will be described.

A first terminal of the transistor 306 is connected to the wiring 15. A second terminal of the transistor 306 is connected to the gate of the transistor 105. A gate of the transistor 306 is connected to the wiring 16.

A first terminal of the transistor 307 is connected to the wiring 13. A second terminal of the transistor 307 is connected to the gate of the transistor 105. A gate of the transistor 307 is connected to the wiring 14.

The transistor 306 has a function of controlling electrical continuity between the wiring 15 and the gate of the transistor 105, a function of supplying the potential VDD of the wiring 15 to the gate of the transistor 105, and a function of raising the gate potential of the transistor 105 and then stopping supply of charge, a potential, a signal, or the like to the gate of the transistor 105.

The transistor 307 has a function of controlling electrical continuity between the wiring 13 and the gate of the transistor 105, and a function of supplying the potential VSS of the wiring 13 to the gate of the transistor 105.

In the period Ta, the signal RE goes high and the signal SP goes low. When the signal RE goes low, the transistor 306 is turned off. When the signal SP goes high, the transistor 307 is turned on. When the transistor 307 is turned on, the potential VSS of the wiring 13 is supplied to the gate of the transistor 105. Thus, the gate potential of the transistor 105 becomes the potential VSS, and the transistor 105 is turned off.

In the period Tb, the signal SP goes low and the signal RE is kept low. When the signal SP goes low, the transistor 306 is turned off. The transistor 307 remains off while the signal RE is kept low. When both of the transistors 306 and 307 are turned off in such a manner, the gate of the transistor 105 becomes floating. Thus, the gate potential of the transistor 105 is kept at the potential VSS, so that the transistor 105 remains off.

In the period Tc, the signal SP is kept low and the signal RE goes high. The transistor 307 remains off while the signal SP is kept low. When the signal RE goes high, the transistor 306 is turned on. When the transistor 306 is turned on, the potential VDD of the wiring 15 is supplied to the gate of the transistor 105, and the gate potential of the transistor 105 rises. When the gate potential of the transistor 105 rises, the transistor 105 is turned on. When the transistor 105 is turned on, the potential VDD of the wiring 15 is supplied to the node N1 and the potential of the node N1 rises as a result. When the gate potential of the transistor 105 becomes a potential obtained by subtracting the threshold voltage of the transistor 306 from the gate potential (e.g., the potential VDD) of the transistor 306, the transistor 306 is turned off. Thus, the gate of the transistor 105 becomes floating. At this time, a potential difference between the gate of the transistor 105 and the node N1 is maintained between the gate and the second terminal of the transistor 105. Accordingly, the gate potential of the transistor 105 rises as the potential of the node N1 rises. The transistor 105 remains on when the gate potential of the transistor 105 exceeds a potential obtained by adding the potential VDD of the wiring 15 and the threshold voltage of the transistor 105. Thus, the potential of the node N1 becomes the potential VDD.

In the period Td, the signal SP is kept low and the signal RE goes low. The transistor 306 remains off while the signal SP is kept low. When the signal RE goes low, the transistor 307 is turned off. When both of the transistors 306 and 307 are turned off in such a manner, the gate of the transistor 105 becomes floating. Thus, the gate potential of the transistor 105 is kept at the potential in the period Tc, so that the transistor 105 remains on.

The sequential circuit in FIG. 10B includes the transistors 306 and 307, whereby the potential of the node N1 can increase to the potential VDD in the period Tc. Thus, Vgs of the transistors 103 and 104 can be increased, which makes it possible to turn on the transistors 103 and 104 more definitely.

In the period Td, the transistor 105 can be kept on, so that the potential VDD of the wiring 15 can continue to be supplied to the node N1. Consequently, the potential of the node N1 can be stably maintained.

Note that the transistors 306 and 307 may be provided in any of the basic circuits, the sequential circuits, and the shift register circuit described in Embodiments 1 to 3.

The transistor 306 may be replaced with a switching element having a first terminal connected to the wiring 15 and a second terminal connected to the gate of the transistor 105.

The transistor 307 may be replaced with a switching element having a first terminal connected to the wiring 13 and a second terminal connected to the gate of the transistor 105.

Note that the first terminal of the transistor 306 may be connected to the wiring 16 or the wiring 17, for example.

A sequential circuit in FIG. 11A has a configuration in which a circuit 308 is provided in the sequential circuit in FIG. 3.

A first terminal of the circuit 308 is connected to the node N1. A second terminal of the circuit 308 is connected to the gate of the transistor 104.

The circuit 308 has a function of outputting a distorted potential or signal of the first terminal from the second terminal; a function of outputting, from the second terminal, a potential or signal of the first terminal with a prolonged rise time and/or fall time; and a function of outputting a delayed potential or signal of the first terminal from the second terminal.

In the period Ta, the potential of the wiring 12 decreases as the potential of the node N1 decreases. At this time, the transistor 104 is on because the gate potential of the transistor 104 starts to decrease after the decrease in the potential of the node N1 starts or because the gate potential of the transistor 104 decreases more slowly than the potential of the node N1. Thus, the potential VSS of the wiring 13 is supplied to the gate of the transistor 101. Then, the gate potential of the transistor 104 falls, and the transistor 104 is turned off.

In the period Tc, the potential of the node N1 rises. At this time, the transistor 104 is off because the gate potential of the transistor 104 starts to rise after the rise in the potential of the node N1 starts or because the gate potential of the transistor 104 rises more slowly than the potential of the node N1. Then, the gate potential of the transistor 104 rises, and the transistor 104 is turned on. Thus, the potential VSS of the wiring 13 is supplied to the gate of the transistor 101, and the transistor 101 is turned off.

In the period Tb and the period Td, the operation of the sequential circuit in FIG. 11A is similar to that of the sequential circuit in FIG. 3 because the potential of the node N1 does not rise or fall significantly.

In the sequential circuit in FIG. 11A, the potential VSS of the wiring 13 can be supplied to the node N2 while the potential of the wiring 12 decreases in the period Ta. Consequently, the decrease in the potential of the node N2 associated with the decrease in the potential of the wiring 12 can be prevented. Preventing the decrease in the potential of the node N2 can further increase the potential of the node N2, whereby Vgs of the transistor 101 can be further increased.

Further, the timing at which the transistor 101 is turned off can be delayed in the period Tc, so that the signal CK of the wiring 11 can be supplied to the wiring 12. Since the signal CK is low, the fall time of the signal OUT can be shortened. The fall time of the signal OUT can be drastically shortened because W/L of the transistor 101 is particularly high in many cases.

Here, specific examples of the circuit 308 will be described.

The circuit 308 in FIG. 11B has a transistor 308a. A first terminal of the transistor 308a is connected to the first terminal of the circuit 308. A second terminal of the transistor 308a is connected to the second terminal of the circuit 308. A gate of the transistor 308a is connected to the wiring 11.

The circuit 308 in FIG. 11C has a configuration in which a transistor 308b is provided in the circuit 308 in FIG. 11B. A first terminal of the transistor 308b is connected to the first terminal of the circuit 308. A second terminal of the transistor 308b is connected to the second terminal of the circuit 308. A gate of the transistor 308b is connected to the second terminal of the circuit 308.

The circuit 308 in FIG. 11D has a configuration in which a transistor 308c is provided in the circuit 308 in FIG. 11B. A first terminal of the transistor 308c is connected to the wiring 11. A second terminal of the transistor 308c is connected to the second terminal of the circuit 308. A gate of the transistor 308c is connected to the first terminal of the circuit 308.

The circuit 308 in FIG. 11E has a configuration in which a transistor 308d and a transistor 308e are provided in the circuit 308 in FIG. 11B. A first terminal of the transistor 308d is connected to the wiring 11. A second terminal of the transistor 308d is connected to the second terminal of the circuit 308. A first terminal of the transistor 308e is connected to the first terminal of the circuit 308. A second terminal of the transistor 308e is connected to a gate of the transistor 308d. A gate of the transistor 308e is connected to the wiring 11.

In the circuit 308 in FIG. 11E, the gate potential of the transistor 308d can be higher than the potential VDD, so that the potential of the second terminal of the circuit 308 can increase to the potential VDD.

Note that the transistors 308a to 308e preferably have the same conductivity type as the transistor 101.

The gate of the transistor 308a, the first terminal of the transistor 308c, the first terminal of the transistor 308d, and/or the gate of the transistor 308e may be connected to the wiring 17, for example.

This embodiment can be implemented in combination with any other embodiment as appropriate.

(Embodiment 4)

Figure 12:
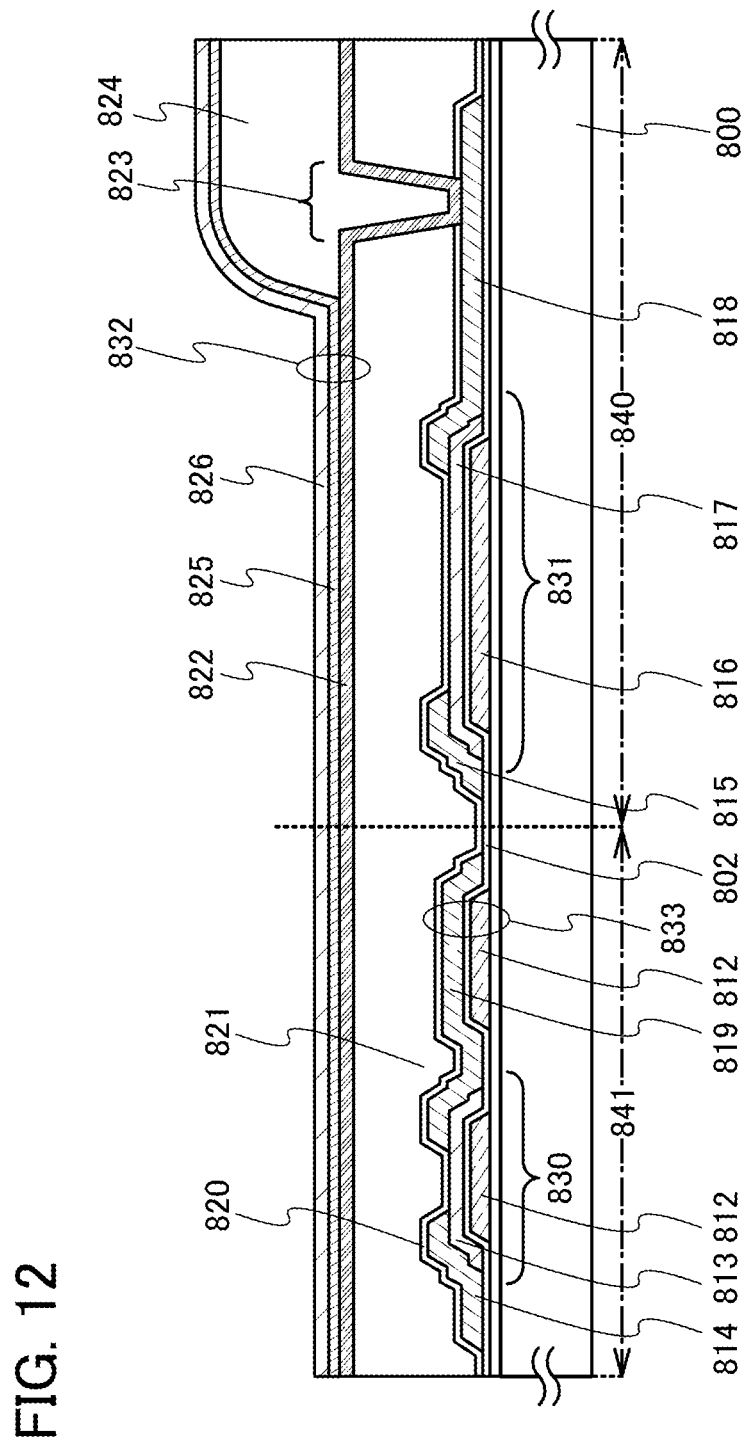
FIG. 12 is a diagram for explaining a display device according to one embodiment of the present invention.

Using an EL display device as an example, cross-sectional structures of a pixel and a driver circuit of a display device according to one embodiment of the present invention will be described with reference to FIG. 12. FIG. 12 exemplifies cross-sectional structures of a pixel 840 and a driver circuit 841.

The pixel 840 includes a light-emitting element 832 and a transistor 831 having a function of supplying current to the light-emitting element 832. In addition to the light-emitting element 832 and the transistor 831, the pixel 840 may also include a variety of semiconductor elements such as a transistor that controls input of an image signal to the pixel 840 and a capacitor that holds the potential of an image signal.

The driver circuit 841 includes a transistor 830 and a capacitor 833 for holding the gate voltage of the transistor 830. The driver circuit 841 corresponds to any of the basic circuits, the sequential circuits, and the shift register circuit described in Embodiments 1 to 3. Specifically, the transistor 830 corresponds to the transistor 101 or the transistor 201, for example. The driver circuit 841 may also include a variety of semiconductor elements such as a transistor and a capacitor in addition to the transistor 830 and the capacitor 833.

The transistor 831 includes, over a substrate 800 having an insulating surface, a conductive film 816 functioning as a gate, a gate insulating film 802 over the conductive film 816, a semiconductor film 817 that overlaps the conductive film 816 with the gate insulating film 802 placed therebetween, and conductive films 815 and 818 that are positioned over the semiconductor film 817 and function as a source terminal and a drain terminal. The conductive film 816 also functions as a scan line.

The transistor 830 includes, over the substrate 800 having an insulating surface, a conductive film 812 functioning as a gate, the gate insulating film 802 over the conductive film 812, a semiconductor film 813 that overlaps the conductive film 812 with the gate insulating film 802 placed therebetween, and conductive films 814 and 819 that are positioned over the semiconductor film 813 and function as a source terminal and a drain terminal.

The capacitor 833 includes, over the substrate 800 having an insulating surface, the conductive film 812, the gate insulating film 802 over the conductive film 812, and the conductive film 819 that overlaps the conductive film 812 with the gate insulating film 802 placed therebetween.

An insulating film 820 and an insulating film 821 are stacked in this order over the conductive films 814, 815, 818, and 819. A conductive film 822 functioning as an anode is formed over the insulating film 821. The conductive film 822 is connected to the conductive film 818 through a contact hole 823 formed in the insulating films 820 and 821.

An insulating film 824 having an opening where part of the conductive film 822 is exposed is provided over the insulating film 821. An EL layer 825 and a conductive film 826 functioning as a cathode are stacked in this order over the part of the conductive film 822 and the insulating film 824. A region where the conductive film 822, the EL layer 825, and the conductive film 826 overlap one another corresponds to the light-emitting element 832.

In one embodiment of the present invention, the transistors 830 and 831 may include a semiconductor film containing an amorphous, microcrystalline, polycrystalline, or single crystal semiconductor (e.g., silicon or germanium), or a semiconductor film containing a wide bandgap semiconductor such as an oxide semiconductor.

When the semiconductor films of the transistors 830 and 831 are formed using an amorphous, microcrystalline, polycrystalline, or single crystal semiconductor (e.g., silicon or germanium), impurity regions functioning as source and drain terminals are formed by addition of an impurity element imparting one conductivity to the semiconductor films. For example, an impurity region having n-type conductivity can be formed by addition of phosphorus or arsenic to the semiconductor film. Further, an impurity region having p-type conductivity can be formed by addition of boron, for example, to the semiconductor film.

In the case where an oxide semiconductor is used for the semiconductor films of the transistors 830 and 831, impurity regions functioning as source and drain terminals may be formed by addition of a dopant to the semiconductor films. The dopant can be added by ion implantation. Examples of the dopant are a rare gas such as helium, argon, and xenon; and a Group 15 element such as nitrogen, phosphorus, arsenic, and antimony. For example, when nitrogen is used as the dopant, the concentration of nitrogen atoms in the impurity region preferably ranges from $5 \times 10^{19}/\text{cm}^3$ to $1 \times 10^{22}/\text{cm}^3$.

As a silicon semiconductor, any of the following can be used, for example: amorphous silicon formed by sputtering or vapor phase growth such as plasma CVD, polycrystalline silicon obtained in such a manner that amorphous silicon is crystallized by laser annealing or the like, and single crystal silicon obtained in such a manner that a surface portion of a single crystal silicon wafer is separated after implantation of hydrogen ions or the like into the silicon wafer.

The oxide semiconductor film contains at least one element selected from In, Ga, Sn, and Zn. Examples of the oxide semiconductor are an oxide of four metal elements, such as an In—Sn—Ga—Zn—O-based oxide semiconductor; oxides of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; oxides of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based material; and oxides of one metal element, such as an In—O-based oxide semiconductor, a Sn—O-based oxide semiconductor, and a Zn—O-based oxide semiconductor. In addition, any of the above oxide semiconductors may contain an element other than In, Ga, Sn, and Zn, for example, $SiO_2$.

For example, an In—Ga—Zn—O-based oxide semiconductor refers to an oxide semiconductor containing indium (In), gallium (Ga), and zinc (Zn), and there is no limitation on the composition thereof.

For the oxide semiconductor film, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as an oxide semiconductor, the atomic ratio of metal elements in a target to be used is In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn—O-based oxide semiconductor with an atomic ratio of In:Zn:O=X:Y:Z, the relation of Z>1.5X+Y is satisfied. The mobility can be increased by keeping the ratio of Zn within the above range.

Note that a purified oxide semiconductor obtained by reduction of impurities serving as electron donors (donors), such as moisture or hydrogen, and by reduction of oxygen defects is an i-type (intrinsic) semiconductor or a substantially i-type semiconductor. A transistor including the purified oxide semiconductor therefore has extremely low off-state current. The band gap of the oxide semiconductor is 2 eV or more, preferably 2.5 eV or more, further preferably 3 eV or more. With the use of an oxide semiconductor film that is highly purified by sufficient decrease in the concentration of impurities such as moisture and hydrogen and reduction of oxygen defects, the off-state current of a transistor can be decreased.

Specifically, various experiments can prove low off-state current of a transistor in which a purified oxide semiconductor is used for a semiconductor film. For example, the off-state current of even a transistor with a channel width of $1 \times 10^6$ μm and a channel length of 10 μm can be less than or equal to the measurement limit of a semiconductor parameter analyzer, that is, less than or equal to $1 \times 10^{-13}$ A when the voltage between a source terminal and a drain terminal (drain voltage) ranges from 1 V to 10 V. In this case, the off-state current density corresponding to a value obtained by dividing the off-state current by the channel width of the transistor is 100 zA/μm or less. In addition, the off-state current has been measured using a circuit in which a capacitor and a transistor were connected to each other and charge flowing into or from the capacitor was controlled by the transistor. For the measurement, the transistor in which a channel formation region is formed in a purified oxide semiconductor film has been used, and the off-state current density of the transistor has been measured from a change in the amount of charge of the capacitor per unit time. As a result, it has been proven that a lower off-state current density of several tens of yoctoamperes per micrometer (yA/μm) is obtained at a voltage between the source terminal and the drain terminal of the transistor of 3 V. Consequently, the off-state current of the transistor in which the channel formation region is formed in the purified oxide semiconductor film is significantly lower than that of a transistor using crystalline silicon.

Unless otherwise specified, in this specification, the off-state current of an n-channel transistor is a current that flows between a source terminal and a drain terminal when the potential of a gate is lower than or equal to 0 with the potential of the source terminal as a reference potential while the potential of the drain terminal is higher than those of the source terminal and the gate. Moreover, in this specification, the off-state current of a p-channel transistor is a current that flows between a source terminal and a drain terminal when the potential of a gate is higher than or equal to 0 with the potential of the source terminal as a reference potential while the potential of the drain terminal is lower than those of the source terminal and the gate.

An oxide semiconductor film can be formed, for example, by sputtering using a target including indium (In), gallium (Ga), and zinc (Zn). When an In—Ga—Zn-based oxide semiconductor film is formed by sputtering, it is preferable to use an In—Ga—Zn-based oxide target having an atomic ratio of In:Ga:Zn=1:1:1, 4:2:3, 3:1:2, 1:1:2, 2:1:3, or 3:1:4. When an oxide semiconductor film is formed using an In—Ga—Zn-based oxide target having the aforementioned atomic ratio, a polycrystal or a c-axis-aligned crystal (CAAC), which is described below, is readily formed.

The filling rate of the target including In, Ga, and Zn is 90% or higher and 100% or lower, preferably 95% or higher and lower than 100%. With the use of the target with high filling rate, a dense oxide semiconductor film is formed.

Specifically, the oxide semiconductor film may be formed as follows: the substrate is held in a treatment chamber with pressure reduced, a sputtering gas from which hydrogen and moisture are removed is introduced while residual moisture in the treatment chamber is removed, and the above-described target is used. The substrate temperature during film formation may range from 100° C. to 600° C., preferably from 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber which is evacuated with the cryopump, for example, a hydrogen atom and a compound containing a hydrogen atom, such as water ($H_2O$) (preferably, a compound containing a carbon atom as well) are removed, whereby the impurity concentration in the oxide semiconductor film formed in the chamber can be reduced.

Note that the oxide semiconductor film formed by sputtering or the like sometimes contains a large amount of moisture or hydrogen (including a hydroxyl group) as impurities. Moisture and hydrogen easily form a donor level and thus serve as impurities in the oxide semiconductor. In one embodiment of the present invention, in order to reduce impurities such as moisture or hydrogen in the oxide semiconductor film (in order to perform dehydration or dehydrogenation), the oxide semiconductor film is subjected to heat treatment in a reduced-pressure atmosphere, an inert gas atmosphere of nitrogen, a rare gas, or the like, an oxygen gas atmosphere, or ultra-dry air (the moisture amount is 20 ppm (−55° C. by conversion into a dew point) or less, preferably 1 ppm or less, further preferably 10 ppb or less in the case where measurement is performed by a dew point meter in a cavity ring-down laser spectroscopy (CRDS) method).

By performing heat treatment on the oxide semiconductor film, moisture or hydrogen in the oxide semiconductor film can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for about 3 to 6 minutes. When an RTA method is used for the heat treatment, dehydration or dehydrogenation can be performed in a short time; therefore, treatment can be performed even at a temperature higher than the strain point of a glass substrate.

Note that in some cases, the heat treatment makes oxygen released from the oxide semiconductor film and an oxygen defect is formed in the oxide semiconductor film. To prevent an oxygen defect, an insulating film including oxygen is used as an insulating film in contact with the oxide semiconductor film, such as a gate insulating film, in one embodiment of the present invention. Then, heat treatment is performed after formation of the insulating film including oxygen, so that oxygen is supplied from the insulating film to the oxide semiconductor film. With the above structure, oxygen defects serving as donors can be reduced in the oxide semiconductor film and the stoichiometric composition of the oxide semiconductor included in the oxide semiconductor film can be satisfied. It is preferable that the proportion of oxygen in the oxide semiconductor film is higher than that in the stoichiometric composition. As a result, the oxide semiconductor film can be made substantially i-type and variations in electrical characteristics of transistors due to oxygen defects can be reduced; thus, electrical characteristics can be improved.

The heat treatment for supplying oxygen to the oxide semiconductor film is performed in a nitrogen atmosphere, ultra-dry air, or a rare gas (e.g., argon or helium) atmosphere preferably at temperatures ranging from 200° C. to 400° C., for example, from 250° C. to 350° C. The water content in the gas is preferably 20 ppm or less, more preferably 1 ppm or less, still more preferably 10 ppb or less.

Note that the oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystalline parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, a grain boundary in the CAAC-OS film is not found with the TEM. Thus, reduction in electron mobility due to the grain boundary is suppressed in the CAAC-OS film.

In each of the crystal parts included in the CAAC-OS film, the c-axis is aligned in a direction parallel to a normal vector of a surface over which the CAAC-OS film is deposited or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 85° to 95°, and the term "parallel" includes a range from −5° to 5° unless otherwise specified.

In the CAAC-OS film, distribution of crystal parts is not necessarily uniform. For example, when crystal growth occurs from a surface side of the oxide semiconductor film in the process of forming the CAAC-OS film, the proportion of crystal parts in the vicinity of the surface of the oxide semiconductor film is sometimes higher than that in the vicinity of the surface over which the oxide semiconductor film is deposited. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of the surface over which the CAAC-OS film is deposited or a normal vector of the surface of the CAAC-OS film, the directions of the c-axes may be different from each other depending on the shape of the CAAC-OS film (the cross-sectional shape of the surface over which the CAAC-OS film is deposited or the cross-sectional shape of the surface of the CAAC-OS film). Note that the direction of c-axis of the crystal part is the direction parallel to a normal vector of the surface over which the CAAC-OS film is deposited or a normal vector of the surface of the CAAC-OS film. The crystal part is formed during deposition or by performing treatment for crystallization such as heat treatment after deposition.

In a transistor including the CAAC-OS film, a change in electrical characteristics due to irradiation with visible light or ultraviolet light is small. Thus, the transistor has high reliability.

Note that part of oxygen included in the oxide semiconductor film may be substituted with nitrogen.

The CAAC-OS film is formed by sputtering using a polycrystalline oxide semiconductor sputtering target, for example. When ions collide with the sputtering target, a crystal region included in the sputtering target might be separated from the target along the a-b plane; in other words, sputtered particles having a plane parallel to the a-b plane (flat plate-like sputtered particles or pellet-like sputtered particles) might flake off from the sputtering target. In this case, the flat plate-like sputtered particles reach a substrate while maintaining their crystal state, whereby the CAAC-OS film can be formed.

The CAAC-OS film is preferably deposited under the following conditions.

Deformation of the crystal due to impurities can be prevented by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is set from 100° C. to 740° C., preferably from 200° C. to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

It is preferable that the proportion of oxygen in the deposition gas be increased and the electric power be optimized in order to reduce plasma damage at the deposition. The proportion of oxygen in the deposition gas is 30 vol % or higher, preferably 100 vol %.

As an example of the sputtering target, an In—Ga—Zn—O compound target will be described below.

A polycrystalline In—Ga—Zn—O compound target is made by mixing $InO_X$ powder, $GaO_Y$ powder, and $ZnO_Z$ powder at a predetermined molar ratio, applying pressure to the mixture, and then performing heat treatment on the mixture at temperatures ranging from 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing the powder can be determined as appropriate depending on the desired sputtering target.

Next, examples of a specific structure of a transistor included in the semiconductor device according to one embodiment of the present invention will be described.

Figure 13A:
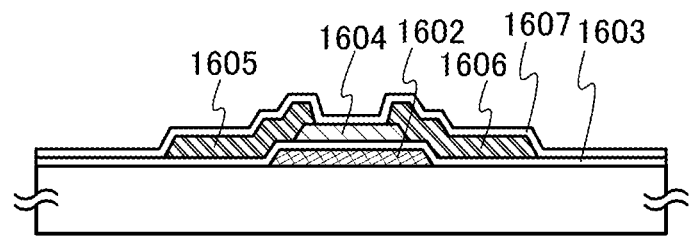
FIGS. 13A to 13D each illustrate a transistor according to one embodiment of the present invention.

A transistor illustrated in FIG. 13A is a bottom-gate transistor with a channel-etched structure.

The transistor illustrated in FIG. 13A includes a gate electrode (gate) 1602 formed on an insulating surface, a gate insulating film 1603 over the gate electrode 1602, a semiconductor film 1604 that overlaps the gate electrode 1602 with the gate insulating film 1603 placed therebetween, and conductive films 1605 and 1606 formed over the semiconductor film 1604. An insulating film 1607 formed over the semiconductor film 1604 and the conductive films 1605 and 1606 may be considered as a component of the transistor.

The transistor in FIG. 13A may also include a backgate electrode that overlaps the semiconductor film 1604 with the insulating film 1607 placed therebetween.

Figure 13B:
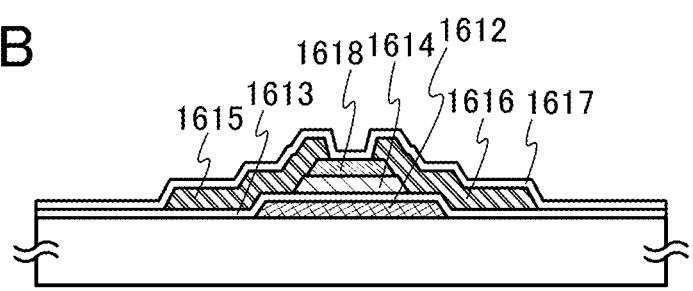

A transistor illustrated in FIG. 13B is a bottom-gate transistor with a channel protective structure.

The transistor illustrated in FIG. 13B includes a gate electrode 1612 formed on an insulating surface, a gate insulating film 1613 over the gate electrode 1612, a semiconductor film 1614 that overlaps the gate electrode 1612 with the gate insulating film 1613 placed therebetween, a channel protective film 1618 formed over the semiconductor film 1614, and conductive films 1615 and 1616 formed over the semiconductor film 1614. An insulating film 1617 formed over the channel protective film 1618 and the conductive films 1615 and 1616 may be considered as a component of the transistor.

The transistor in FIG. 13B may also include a backgate electrode that overlaps the semiconductor film 1614 with the insulating film 1617 placed therebetween.

The channel protective film 1618 can prevent the portion serving as a channel formation region in the semiconductor film 1614 from being damaged in a later step (e.g., from being reduced in thickness by plasma or an etchant in etching). As a result, the reliability of the transistor can be improved.

Figure 13C:
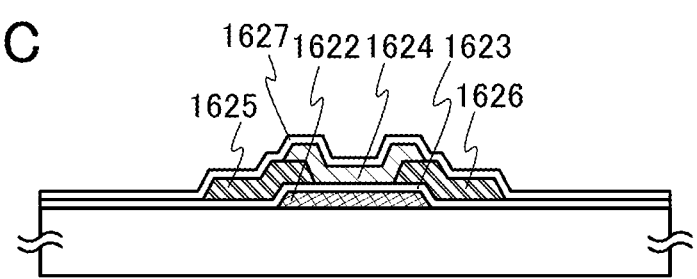

A transistor illustrated in FIG. 13C is a bottom-gate bottom-contact transistor.

The transistor illustrated in FIG. 13C includes a gate electrode 1622 formed on an insulating surface, a gate insulating film 1623 over the gate electrode 1622, conductive films 1625 and 1626 over the gate insulating film 1623, and a semiconductor film 1624 that overlaps the gate electrode 1622 with the gate insulating film 1623 placed therebetween and is formed over the conductive films 1625 and 1626. An insulating film 1627 formed over the conductive films 1625 and 1626 and the semiconductor film 1624 may be considered as a component of the transistor.

The transistor in FIG. 13C may also include a backgate electrode that overlaps the semiconductor film 1624 with the insulating film 1627 placed therebetween.

Figure 13D:
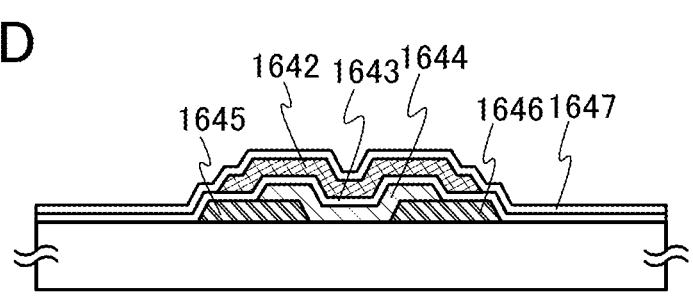

A transistor illustrated in FIG. 13D is a top-gate bottom-contact transistor.

The transistor illustrated in FIG. 13D includes conductive films 1645 and 1646 formed on an insulating surface, a semiconductor film 1644 formed over insulating surface and the conductive films 1645 and 1646, a gate insulating film 1643 formed over the semiconductor film 1644 and the conductive films 1645 and 1646, and a gate electrode 1642 that overlaps the semiconductor film 1644 with the gate insulating film 1643 placed therebetween. An insulating film 1647 formed over the gate electrode 1642 may be considered as a component of the transistor.

The transistor in this embodiment can be used as any of the transistors included in the basic circuits, the sequential circuits, and the shift register circuit described in Embodiments 1 to 3. It should be particularly noted that the off-state of the transistor including an oxide semiconductor is low in this embodiment. Consequently, with the use of such a transistor in the basic circuits, the sequential circuits, and the shift register circuit described in Embodiments 1 to 3, charge leaked from the node N1, the node N2, and the like can be decreased. This leads to lowering of the driving frequency.

This embodiment can be implemented in combination with any other embodiment as appropriate.

(Embodiment 5)

Figure 14:
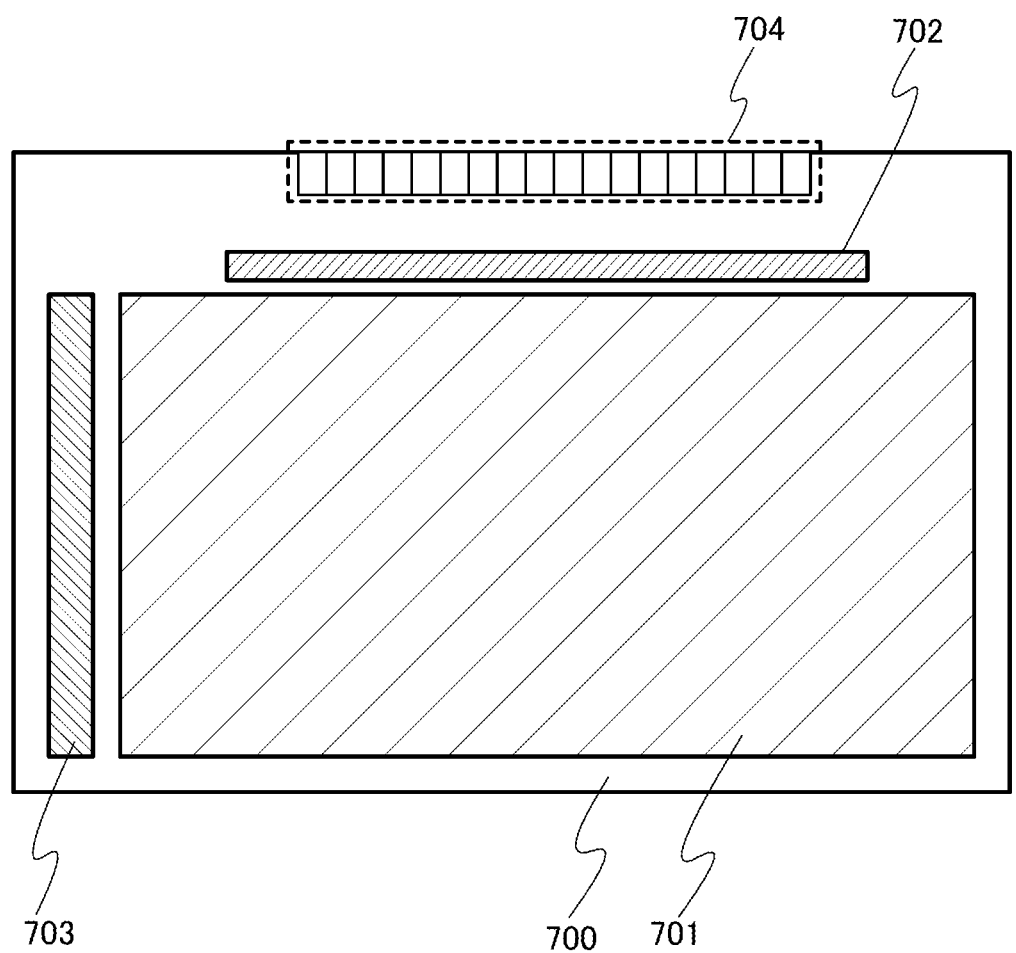
FIG. 14 illustrates a display device according to one embodiment of the present invention.

FIG. 14 illustrates an example of a panel that corresponds to one embodiment of a display device. The panel illustrated in FIG. 14 includes a substrate 700 and a pixel portion 701, a signal line driver circuit 702, a scan line driver circuit 703, and a terminal 704 that are provided over the substrate 700.

The pixel portion 701 includes a plurality of pixels. Each pixel includes a display element and at least one transistor for controlling the operation of the display element. The scan line driver circuit 703 selects a pixel included in the pixel portion 701 by controlling supply of potentials to scan lines connected to the pixels. The signal line driver circuit 702 controls supply of an image signal to the pixel selected by the scan line driver circuit 703.

At least one of the signal line driver circuit 702 and the scan line driver circuit 703 can include the basic circuit, the sequential circuit, or the shift register circuit described in Embodiments 1 to 3. With such a structure, the effects described in Embodiments 1 to 3 can be achieved, and the size of the pixel portion 701 can be increased. Moreover, a larger number of pixels can be provided in the pixel portion 701.

As the display element, a liquid crystal element or a light-emitting element can be used, for example.

This embodiment can be implemented in combination with any other embodiment as appropriate.

(Embodiment 6)

The semiconductor device according to one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can include the semiconductor device according to one embodiment of the present invention are mobile phones, game consoles including portable game consoles, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 15A to 15E illustrate specific examples of these electronic devices.

Figure 15A:
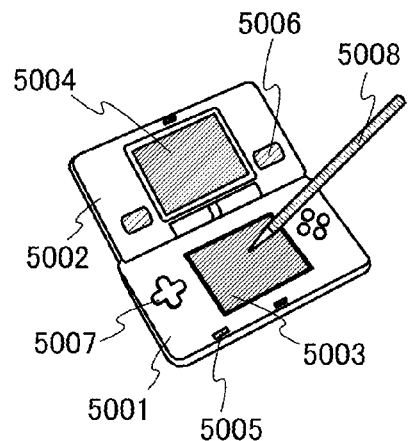
FIGS. 15A to 15E each illustrate an electronic device according to one embodiment of the present invention.

FIG. 15A illustrates a portable game console including a housing 5001, a housing 5002, a display portion 5003, a display portion 5004, a microphone 5005, a speaker 5006, an operation key 5007, a stylus 5008, and the like. By using the semiconductor device according to one embodiment of the present invention in a driver circuit of a portable game console, a low-power portable game console that operates stably can be provided. Note that although the portable game console in FIG. 15A includes the two display portions 5003 and 5004, the number of display portions included in the portable game console is not limited to two.

Figure 15B:
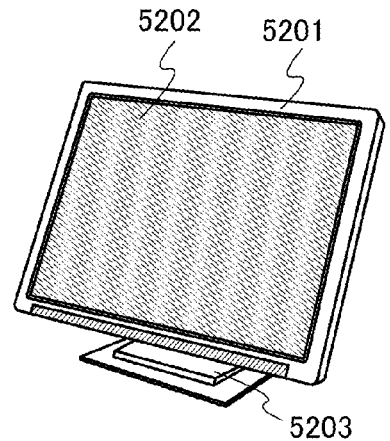

FIG. 15B illustrates a display device including a housing 5201, a display portion 5202, a support base 5203, and the like. By using the semiconductor device according to one embodiment of the present invention in a driver circuit of a display device, a low-power display device that operates stably can be provided. Note that a display device includes, in its category, any display device for displaying information, such as display devices for personal computers, TV broadcast reception, and advertisement.

Figure 15C:
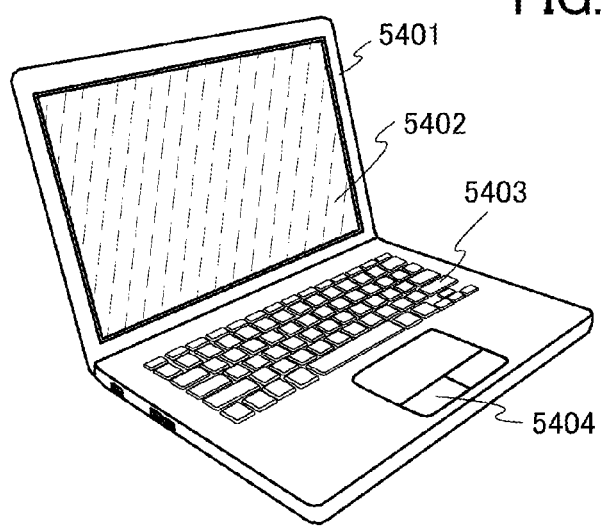

FIG. 15C illustrates a laptop computer including a housing 5401, a display portion 5402, a keyboard 5403, a pointing device 5404, and the like. By using the semiconductor device according to one embodiment of the present invention in a driver circuit of a laptop computer, a low-power laptop computer that operates stably can be provided.

Figure 15D:
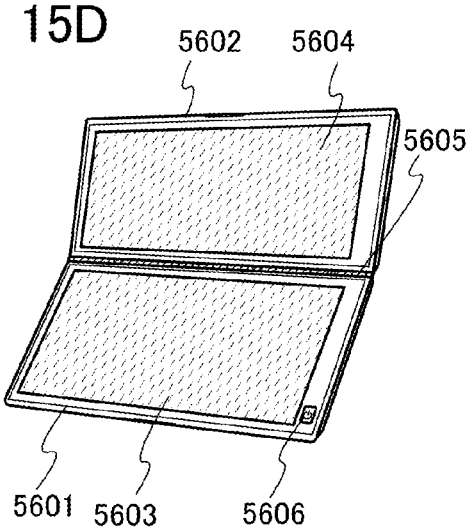

FIG. 15D illustrates a personal digital assistant including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. By using the semiconductor device according to one embodiment of the present invention in a driver circuit of a personal digital assistant, a low-power personal digital assistant that operates stably can be provided.

Figure 15E:
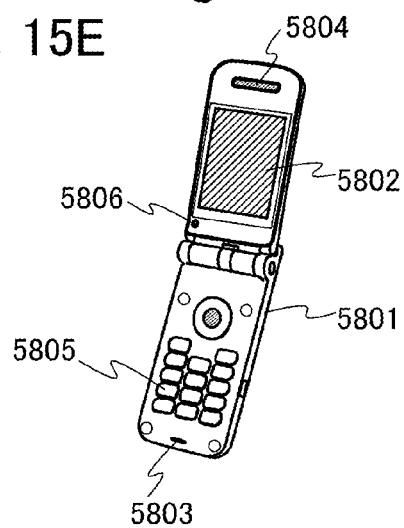
Figure 16:
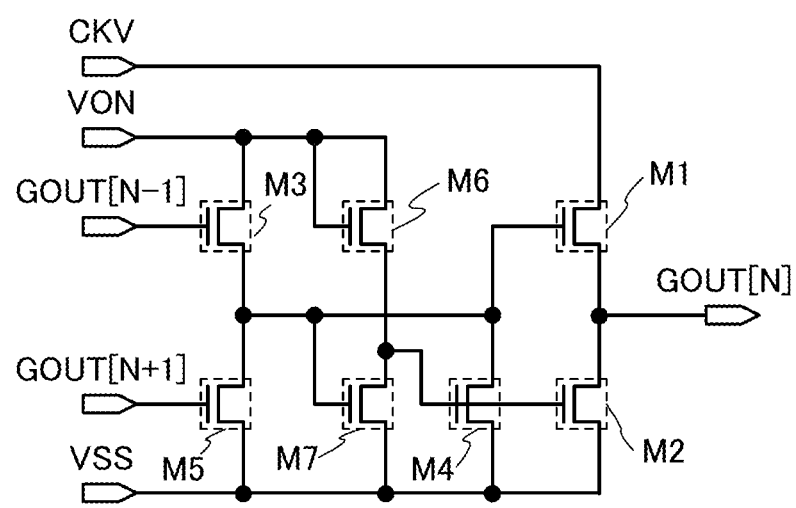
FIG. 16 illustrates a conventional driver circuit.

FIG. 15E illustrates a mobile phone including a housing 5801, a display portion 5802, an audio input portion 5803, an audio output portion 5804, operation keys 5805, a light-receiving portion 5806, and the like. Light received in the light-receiving portion 5806 is converted into electrical signals, whereby external images can be loaded. By using the semiconductor device according to one embodiment of the present invention in a driver circuit of a mobile phone, a low-power mobile phone that operates stably can be provided.

This embodiment can be implemented in combination with any other embodiment as appropriate.

This application is based on Japanese Patent Applications serial No. 2011-265799 filed with Japan Patent Office on Dec. 5, 2011, the entire contents of which are hereby incorporated by reference.

What is claimed is:

1. A semiconductor device comprising:
   a first transistor comprising a source, a drain and a gate;
   a second transistor comprising a source, a drain and a gate;
   a third transistor comprising a source, a drain and a gate;
   a fourth transistor comprising a source, a drain and a gate;

a fifth transistor comprising a source, a drain and a gate; and a sixth transistor comprising a source, a drain and a gate, wherein one of the source and the drain of the first transistor is electrically connected to one of the source and the drain of the third transistor, and the gate of the first transistor is electrically connected to one of the source and the drain of the fourth transistor, wherein one of the source and the drain of the second transistor is electrically connected the gate of the fourth transistor and one of the source and the drain of the fifth transistor, and the other of the source and the drain of the second transistor is electrically connected to the other of the source and the drain of the third transistor and the other of the source and the drain of the fourth transistor, wherein the gate of the third transistor is electrically connected to the gate of the fourth transistor, and wherein one of the source and the drain of the sixth transistor is electrically connected to the one of the source and the drain of the first transistor, the other of the source and the drain of the sixth transistor is electrically connected to the other of the source and the drain of the second transistor, and the gate of the sixth transistor is electrically connected to the gate of the fifth transistor.

2. The semiconductor device according to claim 1, further comprising:

a capacitor comprising a first electrode electrically connected to the one of the source and the drain of the first transistor, and a second electrode electrically connected to the one of the source and the drain of the second transistor.

3. The semiconductor device according to claim 1, wherein a ratio of a channel width to a channel length of the first transistor is higher than a ratio of a channel width to a channel length of the second transistor.

4. The semiconductor device according to claim 1, wherein the first transistor comprises a channel formation region, a gate electrode, and a gate insulating film between the channel formation region and the gate electrode.

5. The semiconductor device according to claim 1, wherein a value obtained by dividing a channel width of the third transistor by a channel length of the third transistor is larger than a value obtained by dividing a channel width of the second transistor by a channel length of the second transistor, and wherein the one of the source and the drain of the first transistor is electrically connected to a sequential circuit.

6. A semiconductor device comprising:

a first transistor comprising a source, a drain and a gate;
a second transistor comprising a source, a drain and a gate;
a third transistor comprising a source, a drain and a gate;
a fourth transistor comprising a source, a drain and a gate;
a fifth transistor comprising a source, a drain and a gate; and a sixth transistor comprising a source, a drain and a gate, wherein one of the source and the drain of the first transistor is electrically connected to one of the source and the drain of the third transistor, and the gate of the first transistor is electrically connected to one of the source and the drain of the fourth transistor, wherein one of the source and the drain of the second transistor is electrically connected the gate of the fourth transistor and one of the source and the drain of the fifth transistor, and the other of the source and the drain of the second transistor is electrically connected to the other of the source and the drain of the third transistor and the other of the source and the drain of the fourth transistor, wherein the gate of the third transistor is electrically connected to the gate of the fourth transistor, and wherein one of the source and the drain of the sixth transistor is electrically connected to the gate of the first transistor, the other of the source and the drain of the sixth transistor is electrically connected to the other of the source and the drain of the fifth transistor, and the gate of the sixth transistor is electrically connected to the gate of the second transistor.

7. The semiconductor device according to claim 6, further comprising:

a capacitor comprising a first electrode electrically connected to the one of the source and the drain of the first transistor, and a second electrode electrically connected to the one of the source and the drain of the second transistor.

8. The semiconductor device according to claim 6, wherein a ratio of a channel width to a channel length of the first transistor is higher than a ratio of a channel width to a channel length of the second transistor.

9. The semiconductor device according to claim 6, wherein the first transistor comprises a channel formation region, a gate electrode, and a gate insulating film between the channel formation region and the gate electrode.

10. The semiconductor device according to claim 6, wherein a value obtained by dividing a channel width of the third transistor by a channel length of the third transistor is larger than a value obtained by dividing a channel width of the second transistor by a channel length of the second transistor, and wherein the one of the source and the drain of the first transistor is electrically connected to a sequential circuit.

11. A semiconductor device comprising:

a first transistor comprising a source, a drain and a gate;
a second transistor comprising a source, a drain and a gate;
a third transistor comprising a source, a drain and a gate;
a fourth transistor comprising a source, a drain and a gate;
a fifth transistor comprising a source, a drain and a gate; and a sixth transistor comprising a source, a drain and a gate, wherein one of the source and the drain of the first transistor is electrically connected to one of the source and the drain of the third transistor, and the gate of the first transistor is electrically connected to one of the source and the drain of the fourth transistor, wherein one of the source and the drain of the second transistor is electrically connected the gate of the fourth transistor and one of the source and the drain of the fifth transistor, and the other of the source and the drain of the second transistor is electrically connected to the other of the source and the drain of the third transistor and the other of the source and the drain of the fourth transistor, wherein the gate of the third transistor is electrically connected to the gate of the fourth transistor, wherein one of the source and the drain of the sixth transistor is electrically connected to the gate of the fifth transistor, and the gate of the sixth transistor is electrically connected to the other of the source and the drain of the fifth transistor, wherein a value obtained by dividing a channel width of the third transistor by a channel length of the third transistor is larger than a value obtained by dividing a channel width of the second transistor by a channel length of the second transistor, and wherein the one of the source and the drain of the first transistor is electrically connected to a sequential circuit.

12. The semiconductor device according to claim 11, further comprising:
a capacitor comprising a first electrode electrically connected to the one of the source and the drain of the first transistor, and a second electrode electrically connected to the one of the source and the drain of the second transistor.

13. The semiconductor device according to claim 11, wherein a ratio of a channel width to a channel length of the first transistor is higher than a ratio of a channel width to a channel length of the second transistor.

14. The semiconductor device according to claim 11, wherein the first transistor comprises a channel formation region, a gate electrode, and a gate insulating film between the channel formation region and the gate electrode.

15. A semiconductor device comprising:
a first transistor comprising a source, a drain and a gate;
a second transistor comprising a source, a drain and a gate;
a third transistor comprising a source, a drain and a gate;
a fourth transistor comprising a source, a drain and a gate;
a fifth transistor comprising a source, a drain and a gate;
a sixth transistor comprising a source, a drain and a gate; and
a seventh transistor comprising a source, a drain and a gate,
wherein one of the source and the drain of the first transistor is electrically connected to one of the source and the drain of the third transistor, and the gate of the first transistor is electrically connected to one of the source and the drain of the fourth transistor,
wherein one of the source and the drain of the second transistor is electrically connected the gate of the fourth transistor and one of the source and the drain of the fifth transistor, and the other of the source and the drain of the second transistor is electrically connected to the other of the source and the drain of the third transistor and the other of the source and the drain of the fourth transistor,
wherein the gate of the third transistor is electrically connected to the gate of the fourth transistor,
wherein one of the source and the drain of the sixth transistor is electrically connected to the other of the source and the drain of the fifth transistor, and the other of the source and the drain of the sixth transistor is electrically connected to the gate of the fifth transistor and one of the source and the drain of the seventh transistor, and
wherein the other of the source and the drain of the seventh transistor is electrically connected to the other of the source and the drain of the second transistor, and the gate of the seventh transistor is electrically connected to the gate of the second transistor.

16. The semiconductor device according to claim 15, further comprising:
a capacitor comprising a first electrode electrically connected to the one of the source and the drain of the first transistor, and a second electrode electrically connected to the one of the source and the drain of the second transistor.

17. The semiconductor device according to claim 15, wherein a ratio of a channel width to a channel length of the first transistor is higher than a ratio of a channel width to a channel length of the second transistor.

18. The semiconductor device according to claim 15, wherein the first transistor comprises a channel formation region, a gate electrode, and a gate insulating film between the channel formation region and the gate electrode.

19. The semiconductor device according to claim 15,
wherein a value obtained by dividing a channel width of the third transistor by a channel length of the third transistor is larger than a value obtained by dividing a channel width of the second transistor by a channel length of the second transistor, and
wherein the one of the source and the drain of the first transistor is electrically connected to a sequential circuit.

* * * * *